United States Patent [19]
Hirukawa et al.

[11] Patent Number: 5,402,224
[45] Date of Patent: Mar. 28, 1995

[54] DISTORTION INSPECTING METHOD FOR PROJECTION OPTICAL SYSTEM

[75] Inventors: Shigeru Hirukawa, Kashiwa; Nobutaka Magome, Kawasaki; Kyoichi Suwa, Tokyo, all of Japan

[73] Assignee: Nikon Corporation, Tokyo, Japan

[21] Appl. No.: 126,393

[22] Filed: Sep. 24, 1993

[30] Foreign Application Priority Data

Sep. 25, 1992 [JP] Japan ................................. 4-256103
Dec. 3, 1992 [JP] Japan ................................. 4-324021

[51] Int. Cl.$^6$ ............................................. G01B 11/00
[52] U.S. Cl. ..................................... 356/124; 355/53; 355/77
[58] Field of Search ............... 356/124, 399, 400, 401; 355/53, 77

[56] References Cited

U.S. PATENT DOCUMENTS

| | | | |
|---|---|---|---|
| 3,260,153 | 7/1966 | Abbott, Jr. et al. | 88/24 |
| 4,585,342 | 4/1986 | Lin et al. | 356/124 |
| 4,629,313 | 12/1986 | Tanimoto | 355/53 |
| 4,710,026 | 12/1987 | Magome et al. | 356/349 |
| 4,759,626 | 7/1988 | Kroko | 356/124 |
| 4,780,616 | 10/1988 | Nishi et al. | 250/548 |
| 4,908,656 | 3/1990 | Suwa et al. | 355/53 |

FOREIGN PATENT DOCUMENTS

63-38697 8/1988 Japan.
4-209518 7/1992 Japan.

*Primary Examiner*—F. L. Evans
*Attorney, Agent, or Firm*—Shapiro and Shapiro

[57] ABSTRACT

A method for inspecting distortion characteristics of a projection optical system to be inspected by arranging a mask formed with measurement patterns at a plurality of predetermined positions on the object surface side of the projection optical system, transferring projected images of the plurality of measurement patterns onto a photosensitive substrate arranged on the image surface side of the projection optical system, and detecting transfer images of the measurement-patterns, includes:

the step of exposing a mask, on which pairs of first and second measurement patterns are arranged adjacent to each other to be separated by a predetermined interval $\Delta T$ in one direction at positions on the mask corresponding to a plurality of points at which distortion amounts are to be inspected in a projection view field of the projection optical system, onto the photosensitive substrate via the projection optical system;

the step of exposing the mask onto the photosensitive substrate via the projection optical system after the mask and the photosensitive substrate are moved relative to each other by an amount determined by the interval $\Delta T$ with respect to the state in the preceding step;

the step of measuring relative displacements between overlapping images of the first and second measurement patterns at different image height points in the projection view field of the projection optical system; and the step of calculating a value obtained by sequentially accumulating the measured relative displacements in units of image height values as a distortion amount at the corresponding image height point.

3 Claims, 16 Drawing Sheets

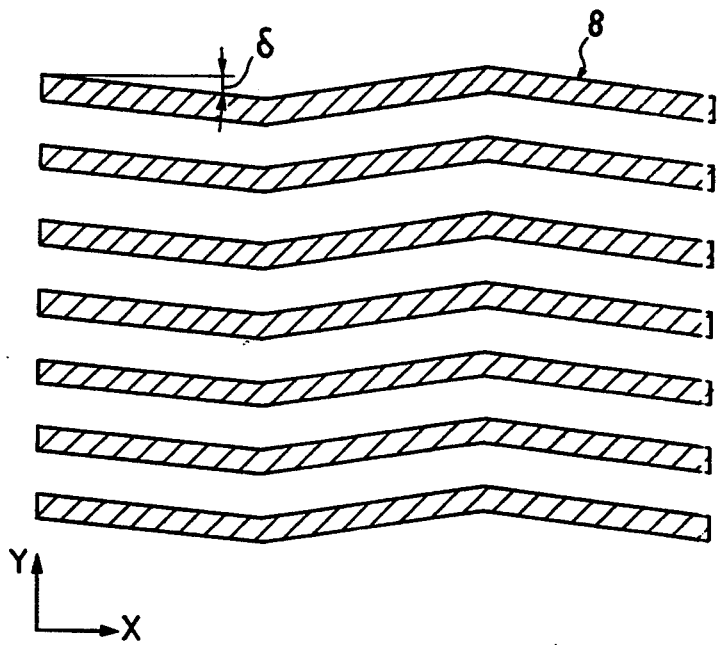
FIG. 16
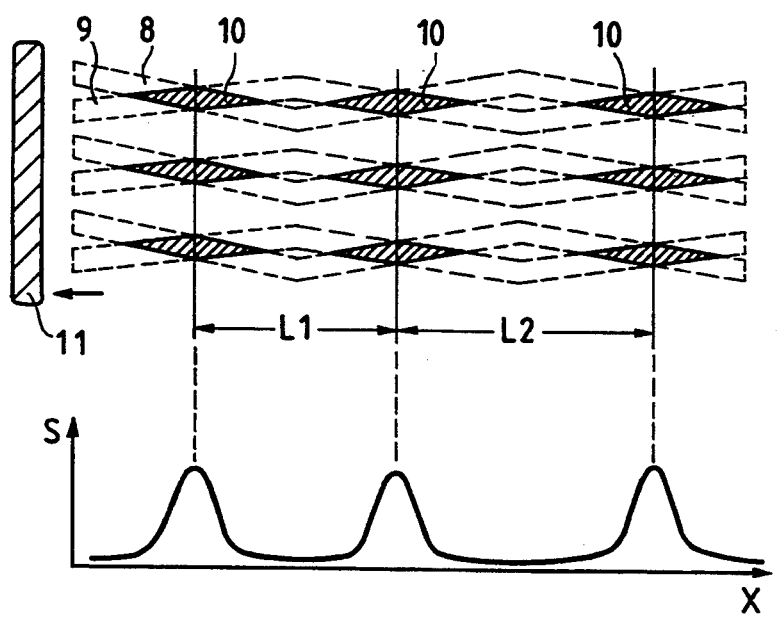
FIG. 17A
FIG. 17B

DISTORTION INSPECTING METHOD FOR PROJECTION OPTICAL SYSTEM

BACKGROUND OF THE INVENTION

1. Field of the Invention

The present invention relates to an inspection method of distortion (a magnification error, a distortion of a projected image, and the like) characteristics of a projection optical system attached to a projection exposure apparatus, which is used in the manufacture of, e.g., a semiconductor element, a liquid crystal display element, a thin-film magnetic head, or the like in a photolithography process.

2. Related Background Art

In recent years, in the manufacture of a semiconductor element, a liquid crystal display element, a thin-film magnetic head, or the like in a photolithography process, a projection exposure apparatus for exposing a pattern on a photomask or a reticle (to be referred to as a "reticle" hereinafter) on a photosensitive substrate via a projection optical system is used. The imaging characteristics required for the projection optical system of such a projection exposure apparatus have a very strict allowable range. Of the imaging characteristics, especially, distortion characteristics (imaging characteristics including a magnification error and a distortion of a projected image) of the projection optical system are adjusted to be optimized in a state wherein the projection optical system is assembled in the projection exposure apparatus. In this case, the distortion characteristics must be measured. Conventionally, the following measurement method is used for this purpose.

(A) Japanese Patent Publication No. 63-38697

In a method disclosed in this reference, a main vernier (main scale) and a sub vernier (sub scale) formed on a test reticle are printed to overlap each other on a resist layer of a photosensitive substrate (e.g., a dummy wafer), and a relative displacement between the resist patterns (main and sub scales) after development is visually inspected. More specifically, the main and sub vernier patterns are formed adjacent to each other at each of the central point of the test reticle and a plurality of points to be measured in a pattern formation region. Upon inspection, the entire surface of the reticle is exposed at a predetermined position on the photosensitive substrate, and thereafter, exposure is repeated while sequentially moving the photosensitive substrate, so that the projected image of the main vernier pattern at the central point overlaps the position of each of the previously exposed sub vernier patterns at the plurality of points. This movement is attained by a precision moving stage comprising a high-precision length measuring device such as a laser interferometer. Also, the moving amount is uniquely determined in correspondence with the designed interval between the central point on the reticle and each of the plurality of points. After the moving stage is precisely moved by a distance corresponding to the interval, the projected image of the main vernier pattern at the central point is exposed at the position of each sub vernier pattern previously exposed on the photosensitive substrate.

On the photosensitive substrate after development, resist images of overlapping main and sub vernier patterns are formed at a plurality of positions around the resist image of the main vernier pattern corresponding to the central point on the reticle. When the resist image of the overlapping vernier patterns is read visually (via a microscope), an overlapping error amount at that point can be obtained. If the feed operation of the moving stage is sufficiently precise, the read value (overlapping error amount) of the vernier patterns corresponds to a distortion amount at that point. Thus, by reading the resist images of the overlapping vernier patterns at the respective points, the distortion amounts (deviation amounts) at the respective points are obtained, thereby confirming the distortion characteristics over the entire projection field of the projection optical system.

(B) Japanese Laid-Open Patent Application No. 59-94032 (corresponding U.S. Pat. No. 4,629,313)

A method disclosed in this reference does not require printing onto a photosensitive substrate unlike in the above-mentioned prior art (A). For this purpose, a photoelectric sensor with a very small slit opening is arranged on a moving stage in a projection optical apparatus so as to directly photoelectrically detect a portion of a projected reticle pattern. More specifically, slit-shaped marks are formed at a plurality of designed positions on a test reticle, and the entire surface of this reticle is projected onto the moving stage by the projection optical system. The moving stage is moved, so that the image of each of the projected marks is detected by the photoelectric sensor, and the position is measured by a laser interferometer, thereby obtaining the projected position of each mark. Thereafter, the distortion characteristics of the projection optical system are calculated from the relationship between the measured mark positions and the mark arrangement on the reticle.

(C) Japanese Laid-Open Patent Application No. 63-177421 (corresponding U.S. Pat. No. 4,780,616)

In a method disclosed in this reference, a slit-shaped light-emitting mark is arranged on a moving stage in pace of the photoelectric sensor in the prior art (B), the light-emitting mark is reversely projected onto a reticle via a projection optical system to scan a plurality of marks on the reticle with the light-emitting mark image by moving the moving stage, and the amount of light transmitted through the reticle is received by a photoelectric sensor arranged in an exposure illumination optical system. The coordinate position on the moving stage, where the light-emitting mark overlaps each of the plurality of marks on the reticle is measured by a laser interferometer, and the distortion characteristics are measured on the basis of the measured coordinate positions and the mark arrangement on the reticle.

(D) Other Methods

As another method, a test reticle formed with a plurality of marks whose positions are known in advance is exposed on a photosensitive substrate via a projection optical system, the positional relationship among resist images of the formed marks after development is directly measured by a high-precision measurement device, and the measurement values are compared with the designed positions of the marks on the reticle, thereby obtaining the distortion characteristics. As a method without development, latent images of marks exposed on a resist layer of a photosensitive substrate, or mark images exposed and visualized on a photochromic layer formed on the surface of a photosensitive substrate in place of the resist layer may be detected.

The above-mentioned prior arts suffer from the following drawbacks or problems.

In the prior art (A), since the stage on which the photosensitive substrate is placed is two-dimensionally and repetitively step-moved to expose patterns to partially overlap each other, stop precision of the stage to each step-movement position, yawing precision, and the like are undesirably included in the measurement value of the distortion amount as an error. Furthermore, since the distance from the main vernier pattern at the central portion on the test reticle to the sub vernier pattern on a peripheral portion is as large as a maximum of about 50 mm, a drawing error (arrangement error) of each vernier pattern upon manufacture of the test reticle may sometimes be large, and be included in the measurement value of the distortion amount as an error. Such errors upon manufacture of the reticle may be measured in advance using another high-precision measurement device, and may be canceled if the measured errors are used as correction values upon calculation of the distortion amounts. However, an error corresponding to the precision of the correction values, in other words, corresponding to the measurement precision of the high-precision measurement device still remains.

Also, since the prior art (A) requires a large number of times of partial overlapping exposure, a relatively long period of time is required until all overlapping exposure processes are completed. The long exposure process time for measurement poses a serious problem since the measurement result is directly influenced by deterioration (drift) of alignment precision caused by stability (e.g., air fluctuations) of the laser interferometer used in position measurement of the moving stage, as well as an increase in load on an operator and a decrease in throughput.

Since the prior arts (B) and (C) do not require a development process which is indispensable in the prior art (A), the load on an operator is reduced accordingly. However, the problems of moving precision of the moving stage, stability of the laser interferometer, arrangement errors of marks on the reticles, and the like are similarly posed as in the prior art (A). Furthermore, in the prior arts (B) and (C) as well, since the number of times of movement of the stage is large, a considerably long period of time is required until the positions of all marks (e.g., 200 marks) are measured.

Of the prior arts (D), the method for detecting latent images or the like is convenient in that the development process is omitted. However, not only improvement of detection precision of latent images, but also moving precision of the moving stage, temporal stability of the laser interferometer, arrangement errors of reticle marks, and the like remain unsolved as unavoidable problems.

As described above, in conventional distortion measurement, as problems of the exposure apparatus, step movement precision and moving precision (including unstable factors of the laser interferometer) of the moving stage are common drawbacks. Furthermore, the prior art (A) requires a very long period of time for the exposure operation, and the prior arts (B), (C), and (D) require a very long period of time for the measurement operation.

SUMMARY OF THE INVENTION

It is, therefore, an object of the present invention to provide a distortion inspection method, which can solve the above-mentioned problems, and can improve precision.

It is another object of the present invention to provide a method for satisfactorily correcting stepping errors (stepping correction errors), and quickly obtaining precise distortion measurement results. It is still another object of the present invention to provide a method for satisfactorily correcting a magnification error caused by a difference between rotation errors of shots having different measurement directions, and quickly obtaining precise distortion measurement results.

In order to achieve these objects, according to the present invention, the number of times of overlapping exposure of measurement marks on a test reticle onto a photosensitive substrate (a substrate coated with a photoresist or photochromic layer) is limited to at least two, and a moving stage is moved only once during these exposure processes. More specifically, the present invention executes the first step of projecting and exposing a mask (reticle R), on which a pair of a first measurement pattern (BMx or BMy) and a second measurement pattern (BSx or BSy) are formed adjacent to each other to be separated by a predetermined interval $\Delta T$ ($\Delta Tx$ or $\Delta Ty$) in one direction (X or Y direction) at each of positions corresponding to a plurality of distortion amount measurement points in a view field of a projection optical system to be inspected, onto a photosensitive substrate (wafer W). Thereafter, the second step of immediately moving the mask and the photosensitive substrate relative to each other by an amount determined by the interval $\Delta T$ ($\Delta T$ when the mask is moved; $M \cdot \Delta T$ in consideration of a projection magnification M when the wafer W is moved), and projecting and exposing the pattern on the same mask onto the photosensitive substrate is executed. Since the interval $\Delta T$ is about 1 mm on the mask, the time interval between the exposure processes in the first and second steps is only the moving time of the mask or wafer, and is normally within 1 sec. Thereafter, the relative displacement or position deviation amount of the overlapping images, formed on the photosensitive substrate, of the first and second measurement patterns (these patterns may be laterally shifted in a non-measurement direction) is measured at each of a plurality of different image height points in a projection view field. This measurement value is a differential value associated with a small width $\Delta T$ at the corresponding image height point on a distortion curve, in other words, an inclination amount on the distortion curve at a certain image height point.

Then, the step of calculating a distortion amount at that image height point by sequentially accumulating the measured relative displacements in the order of image height values is executed.

The term "accumulating" herein means that the distortion amount at a certain image height point of interest is calculated as a sum of values measured at image height points smaller than the point of interest.

Furthermore, the distortion inspection method for measuring the differential value is improved as follows.

The method comprises: the first step (step 101) of exposing an image (7P) on a mask, on which, at a plurality of positions to be subjected to distortion amount inspection in a projection view field of a projection optical system, pairs each consisting of a first main measurement mark (XMy) and a first sub measurement mark (XSy), which are aligned at an interval $\Delta T1$ in a first measurement direction (X direction), are formed at an interval Sx in the X direction, and pairs each consisting of a second main measurement mark (YMx) and a second sub measurement mark (YSx), which are aligned at an interval $\Delta T2$ in a second measurement direction (Y direction), are formed at an interval Sy in the Y direction, onto a photosensitive substrate through the projection optical system; and the second step (steps 102 and 103) of moving the mask and the photosensitive substrate relative to each other in the first measurement direction by an amount ($\Delta a = Sx - \Delta T1$) determined by the intervals $\Delta T1$ and $Sx$, thereafter, exposing the image (7P) on the mask onto the photosensitive substrate via the projection optical system, moving the mask and the photosensitive substrate relative to each other in the second measurement direction by an amount ($\Delta b = Sy - \Delta T2$) determined by the intervals $\Delta T2$ and $Sy$, and thereafter, exposing the image (7P) on the mask onto the photosensitive substrate via the projection optical system.

According to the present invention, the method further comprises: the third step (step 106) of measuring a relative displacement, in the first measurement direction, between the image of the first main measurement mark (XMy) and the image of the first sub measurement mark (XSy), and a relative displacement, in the second measurement direction, between the image of the second main measurement mark (YMx) and the image of the second sub measurement mark (YSx) at each of positions, corresponding to the plurality of points to be subjected to distortion amount inspection of the projection optical system, on the photosensitive substrate; and the fourth step (step 102) of moving the photosensitive substrate in the first measurement direction by an amount (Px) substantially equal to an exposure field size of the projection optical system, thereafter, exposing the images of the first main measurement marks (XMy) on the mask onto the photosensitive substrate via the projection optical system, moving the photosensitive substrate in the second measurement direction by an amount (Py) substantially equal to the exposure field size of the projection optical system, and thereafter, exposing the images of the second main measurement marks on the mask onto the photosensitive substrate via the projection optical system.

According to the present invention, the method further comprises: the fifth step (steps 103 and 104) of exposing the images of the first sub measurement marks (XSy) near the images of the first main measurement marks exposed in the fourth step, and exposing the images of the second sub measurement marks (YSx) near the images of the second main measurement marks exposed in the fourth step; and the sixth step (step 107) of calculating stepping errors of the photosensitive substrate in the first and second measurement directions on the basis of intervals between the images of the first and second main measurement marks exposed in the fourth step, and the images of the first and second sub measurement marks exposed in the fifth step, wherein the relative displacements measured in the third step are accumulated while correcting the stepping errors of the photosensitive substrate calculated in the sixth step, thereby calculating a distortion amount of the projection optical system.

In this case, it is preferable that, from the image on the mask exposed in the second step, a relative rotational amount between a case wherein an image is exposed after the mask and the photosensitive substrate are moved relative to each other in the first measurement direction by the amount ($\Delta a$) determined by the intervals $\Delta T1$ and $Sx$, and a case wherein an image is exposed after the mask and the photosensitive substrate are moved relative to each other in the second measurement direction by the amount ($\Delta b$) determined by the intervals $\Delta T2$ and $Sy$ is calculated, the stepping errors of the photosensitive substrate calculated in the sixth step are corrected to correct the relative rotational amount, and thereafter, the relative displacements measured in the third step are accumulated to calculate the distortion amount of the projection optical system.

As described above, according to the present invention, the distortion amount at a certain image height point is not directly measured unlike in a conventional method, but is measured as a differential value (difference). In other words, the mask and the photosensitive substrate are finely moved within a range wherein the distortion amount can be measured as a differential value, and at least two overlapping exposure processes need only be performed. For this reason, the exposure operation can be greatly facilitated as compared to the conventional method, and the operation time can be shortened. Also, since the relative moving amount between the mask and the photosensitive substrate can be small, and the time interval between the first and second exposure processes is very short, an error of a position measurement sensor (e.g., a laser interferometer) of a moving stage can be minimized, and can be considered as "zero" in practice. Furthermore, since the first and second measurement patterns formed on the mask are arranged very close to each other, a drawing error caused by an EB drawing device is very small. However, when the pair of the first and second measurement patterns formed on the mask are drawn at a plurality of positions on almost the entire surface on the mask, the interval (Sx, Sy) between adjacent positions may become larger than one field size of the EB drawing device on the mask. For this reason, arrangement errors of the measurement pattern pairs are expected to occur. However, such arrangement errors are not so large errors in practice even if they exist. This is because even if the measurement patterns suffer from very small arrangement errors, the error amount itself is considerably smaller than the relative moving amount $\Delta T$ between the mask and the photosensitive substrate upon overlapping exposure, and the differential value (inclination) at that measurement point is normally smaller than 1. Furthermore, the arrangement errors of the plurality of measurement pattern pairs on the mask need not be measured with high precision in advance, and need only be actually measured as the positions (image height values) of the pattern images on the double-exposed photosensitive substrate, if necessary.

According to the improved method of the present invention, since the stepping errors of the photosensitive substrate are calculated, the stepping errors (stepping correction errors) are satisfactorily corrected after a differential method is used, and a precise distortion measurement result can be quickly obtained.

Furthermore, when the relative rotational amount between the exposure process after movement in the first measurement direction and the exposure process after movement in the second measurement direction is obtained, a magnification error caused by a difference between rotation errors of shots having different measurement directions can be satisfactorily corrected after the differential method is used, and a precise distortion measurement result can be quickly obtained.

BRIEF DESCRIPTION OF THE DRAWINGS

FIG. 16 is an enlarged view showing the detailed shapes of fiducial mark images XMx and YMx in the measurement mark image MP(i, j);

FIG. 17A is a graph for explaining a method of measuring a relative displacement between the mark image shown in FIG. 16 and a mark image obtained by rotating the mark image in FIG. 16 through 180°, and FIG. 17B is a waveform chart showing a scanning signal obtained from the pattern shown in FIG. 17A;

DESCRIPTION OF THE PREFERRED EMBODIMENTS

1. Principle of the Present Invention

Figure 1A:
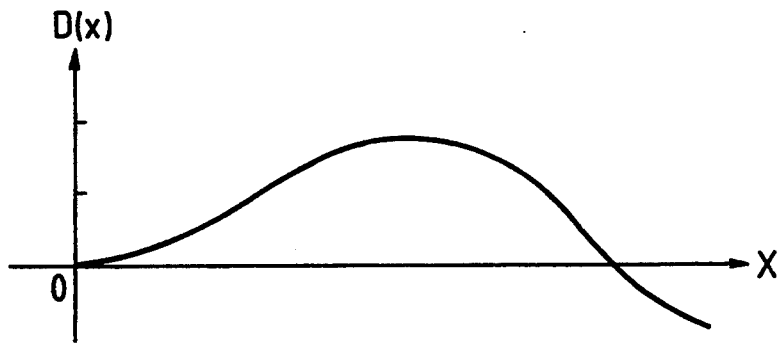
FIGS. 1A to 1D are graphs for explaining the principle of the present invention.
Figure 1B:
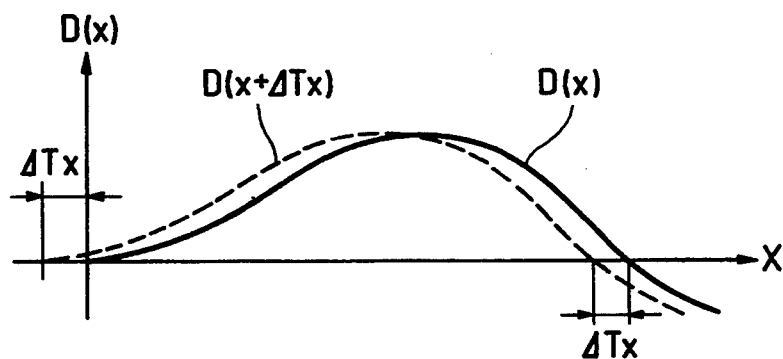

The principle of the present invention will be described below with reference to FIGS. 1A to 1D. FIG. 1A shows an example of distortion characteristics. In FIG. 1A, the center of the field of view of a projection optical system, i.e., the image height from the optical axis is plotted along the X axis (abscissa), and a distortion amount D(x) is plotted along the ordinate.

Assume that a plurality of measurement patterns formed on a reticle are arranged at a predetermined interval Sx (e.g., 5 mm on the reticle) in the X direction, and patterns to be overlap-exposed in each measurement pattern are separated by $\Delta Tx$ ($\Delta Tx < Sx$) in the X direction. A measurement pattern group (located at the interval Sx along the X axis) exposed first on a photosensitive substrate is transferred with the distortion characteristics, as shown in FIG. 1A. Note that the distortion amount D(x) assumes a positive value when a point image to be originally transferred at an ideal grating point deviates in a direction to separate from the optical axis in the projection view field with respect to the ideal grating point, and assumes a negative value when the point image deviates in a direction to approach the optical axis, conversely.

Then, the reticle and the photosensitive substrate are shifted relative to each other by $\Delta Tx$, and exposure is performed again. At this time, a measurement pattern group transferred onto the photosensitive substrate is exposed with distortion characteristics $D(x+\Delta Tx)$ represented by a broken curve in FIG. 1B.

Figure 1C:
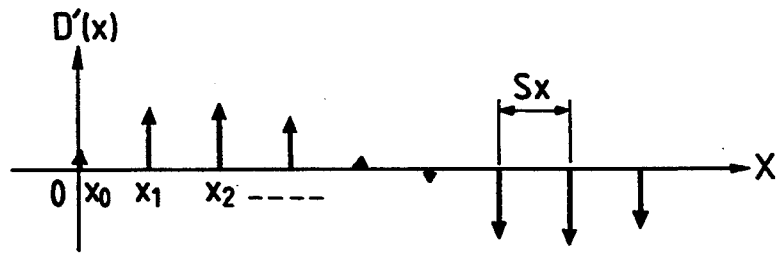

A relative displacement, in the X direction, between the two patterns formed at the interval Sx in the X direction by overlapping exposure with the shift $\Delta Tx$ is measured at positions $x_0, x_1, x_2, \ldots$ separated at the interval Sx. As a result of this measurement, data shown in FIG. 1C are obtained. Each of relative displacements $D'(x)$ at the positions $x_0, x_1, x_2, \ldots$ corresponds to the difference between the two distortion characteristics $D(x)$ and $D(x+\Delta Tx)$ at the corresponding position, in other words, corresponds to a differential coefficient (inclination amount) on the distortion characteristics $D(x)$.

Figure 1D:
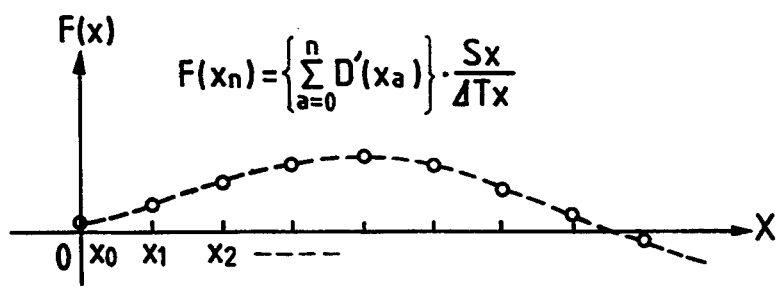

Based on these data, integration shown in FIG. 1D is executed. More specifically, if the distortion amount to be obtained at a position $x_n$ is represented by $F(x_n)$, an algebraic sum of $F(x_n) = \{D'(x_0) + D'(x_1) \ldots + D'(x_n)\} \cdot Sx/\Delta Tx$ is calculated. Note that n represents the order (0, 1, 2, ...) of measurement points having the central point of the projection view field as zero, and yields $F(x_0) = \{D'(x_0)\} \cdot Sx/\Delta Tx$, and $F(x_1) = \{D'(x_0) + D'(x_1)\} \cdot Sx/\Delta Tx$. Characteristics obtained by plotting an accumulation value $F(x)$ at the positions $x_0, x_1, x_2, \ldots$ obtained by the above-mentioned calculation are nothing but distortion characteristics $D(x)$ or $D(x+\Delta Tx)$.

In this manner, when the reticle and the photosensitive substrates are moved relative each other by $\Delta T$, and overlapping exposure is performed, the relative displacement between the two formed patterns is measured as an inclination amount on the distortion characteristics (curve). In general, since the distortion of such a projection optical system is originally very small, the number of points to be measured is preferably increased as much as possible. Also, since the relative displacement between the patterns at each measurement point is very small, a measurement sensor or a measurement method with a very high resolution must be used.

2. Basic Embodiments

The first embodiment of the present invention will be described below with reference to FIGS. 2 to 5.

Figure 2:
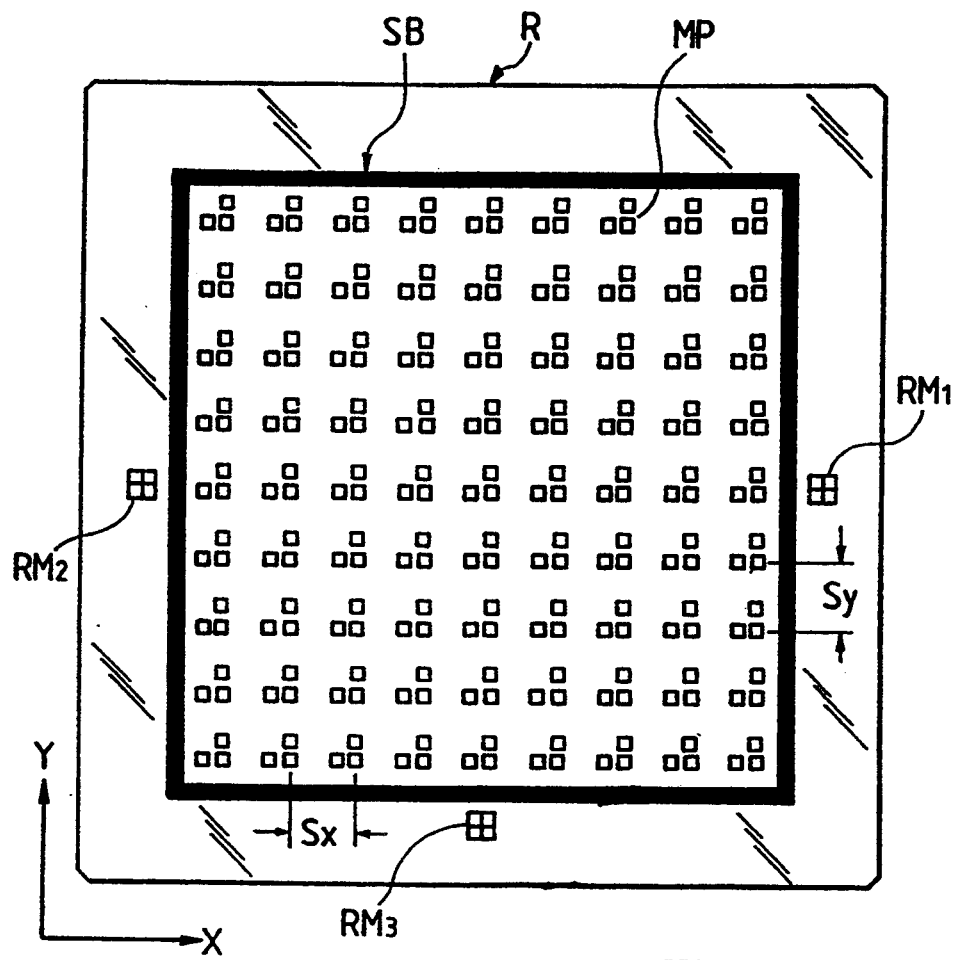
FIG. 2 is a plan view showing a preferred pattern arrangement on a reticle according to the first embodiment of the present invention.

FIG. 2 shows an arrangement of various patterns formed on a reticle R used in this embodiment. The pattern formation region on the reticle R is defined by a light-shielding band SB having a rectangular frame shape. At three positions outside the light-shielding band SB and on the periphery of the reticle R, reticle marks $RM_1$, $RM_2$, and $RM_3$ which are used in alignment (reticle alignment) upon attachment onto a projection exposure apparatus (to be referred to as a stepper hereinafter) are formed.

In the pattern formation region, 81 measurement pattern groups MP (see FIG. 2A) are formed in a 9×9 matrix. The pattern groups MP are arranged to be separated by an interval Sx in the X direction, and by an interval Sy in the Y direction, and one of these pattern groups MP is arranged at the central point of the reticle R, i.e., a point where the optical axis of the projection optical system passes. Each pattern group MP is formed to have a size smaller than one field size (e.g., 5 mm square) of an electron beam (EB) exposure apparatus, and pattern elements in one pattern group MP are simultaneously drawn by raster scanning, vector scanning, and the like of an electron beam of the EB exposure apparatus. In order to draw all the pattern groups MP on the reticle R, a precision moving stage of the EP exposure apparatus is step-moved by a pitch Sx in the X direction and by a pitch Sy in the Y direction, and the pattern group MP is drawn at each step position.

Figure 2A:
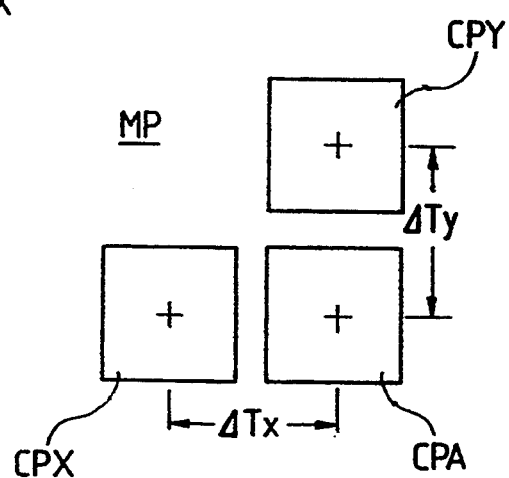
FIG. 2A is a plan view of a pattern group of the pattern arrangement of FIG. 2.

As shown in FIG. 2A, each pattern group MP includes three pattern element regions CPA, CPX, and CPY having the same size. The pattern element region CPA is a portion serving as the center of measurement. The central point of the region CPX is separated from the central point of the region CPA by $\Delta Tx$ in the X direction, and the central point of the region CPY is separated therefrom by $\Delta Ty$ in the Y direction.

Figure 3:
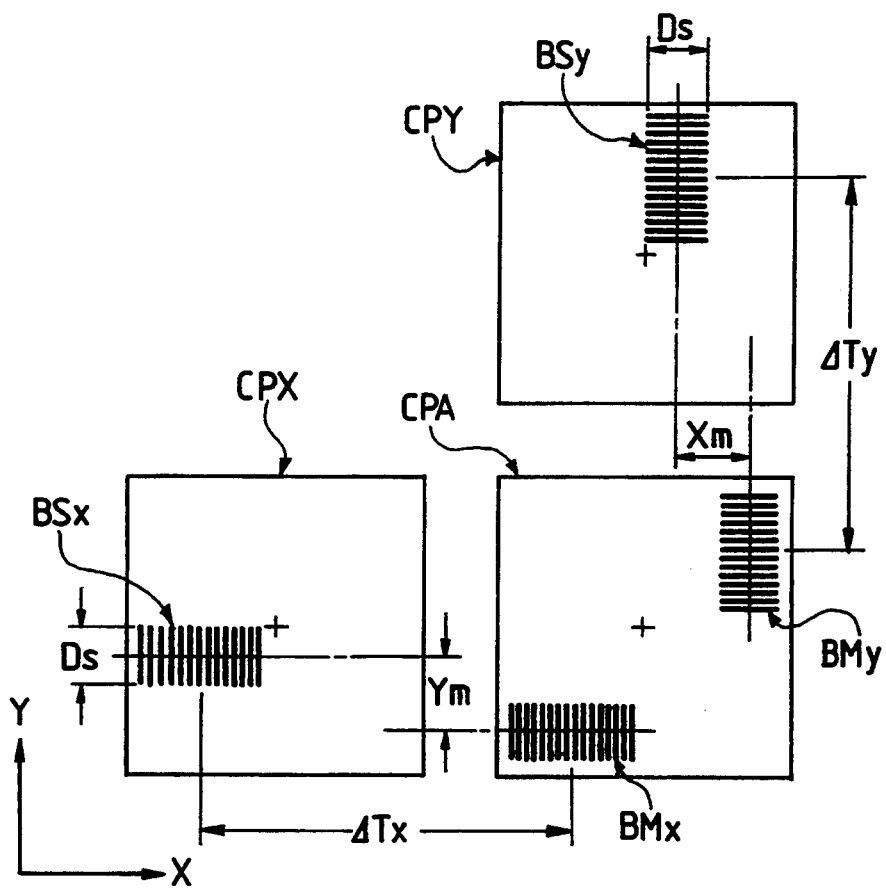
FIG. 3 is a plan view showing an internal arrangement of a pattern group at a certain position in FIG. 2.

A pattern element formed in each of the regions CPA, CPX, and CPY is a one-dimensional grating pattern, as shown in FIG. 3, in this embodiment. In the region CPA, a grating pattern BMx formed at a predetermined pitch in the X direction, and a grating pattern BMy (having the same outer dimensions as that of BMx) formed at a predetermined pitch in the Y direction are arranged to have a 90° relationship therebetween. In the region CPX, a grating pattern BSx having the same shape and structure as those of the pattern BMx is formed at a position separated by $\Delta Tx$ from the grating pattern BMx in the X direction, and offset by Ym in the Y direction. Furthermore, in the region CPY, a grating pattern BSy which is the same as the pattern BMy is arranged at a position separated by $\Delta Ty$ from the grating pattern BMy in the Y direction, and offset by Xm in the X direction. The width of these grating patterns BMx, BMy, BSx, and BSy in the direction perpendicular to the pitch direction is Ds, and in this embodiment, $Xm=Ym>Ds$ is set.

Figure 4:
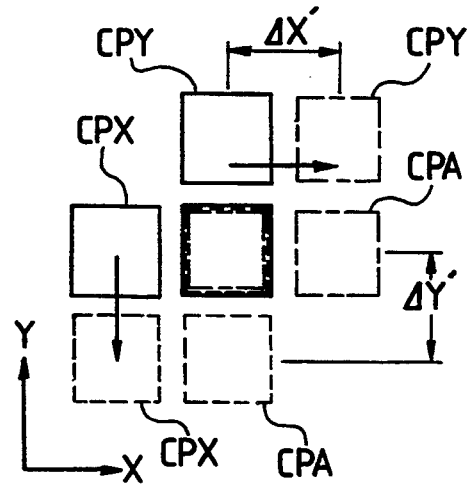
FIG. 4 is a view for explaining an overlapping exposure method of pattern groups.

When such a reticle R is mounted on the stepper, and is exposed, shift exposure shown in FIG. 4 is executed in this embodiment. In a stepper utilizing a full field, the patterns on the reticle R are transferred onto the photosensitive substrate to satisfy a mirror-image relationship, i.e., to be inverted in the vertical and horizontal directions. However, for the sake of simplicity, FIG. 4 shows the patterns under an assumption that the pattern arrangement shown in FIG. 3 is exposed onto the photosensitive substrate without any inversion. Although FIG. 4 illustrates only one pattern group MP, the same applies to other pattern groups MP on the reticle. In the first exposure process, the three pattern element regions CPA, CPX, and CPY are transferred onto the photosensitive substrate, as indicated by a solid line in FIG. 4. In the second exposure process (a state indicated by an alternate long and short dashed line in FIG. 4), the photosensitive substrate is precisely moved by $\Delta X'$ in the X direction. Furthermore, in the third exposure process (a state indicated by a broken line in FIG. 4), the photosensitive substrate is moved by $\Delta Y'$ from the first exposure position in the Y direction. As a result, the images of the regions CPX and CPY are transferred to overlap each other at the first exposure position of the image of the region CPA. The moving amounts $\Delta X'$ and $\Delta Y'$ of the photosensitive substrate correspond to the intervals $\Delta Tx$ and $\Delta Ty$ of the regions CPA, CPX, and CPY on the reticle R, and are set to satisfy $\Delta Tx = M \cdot \Delta X'$ and $\Delta Ty = M \cdot \Delta Y'$ if the nominal projection magnification of the projection optical system of the stepper is represented by M (in the case of a ×1/5 reduction scale, M=5).

Figure 5:
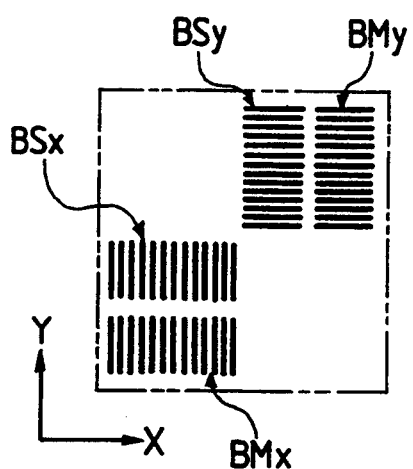
FIG. 5 is a view showing a pattern shape obtained by overlapping exposure.

As described above, on a portion of the photosensitive substrate where the images of the three regions CPA, CPX, and CPY are exposed to overlap each other, the images of the four grating patterns BMx, BMy, BSx, and BSy are transferred in an aligned state, as shown in FIG. 5. When the photosensitive substrate is developed, the grating patterns appear as resist images (three-dimensional patterns). When the relative displacement, in the X direction, between the grating patterns BSx and BMx on the photosensitive substrate, and the relative displacement, in the Y direction, between the grating patterns BSy and BMy are measured, distortion change rates (inclination amount) in the X and Y directions at a point in the projection view field where the pattern group MP is located can be obtained.

As is apparent from the above description, since the images of the three regions CPA, CPX, and CPY are printed to overlap each other, each of the regions CPA, CPX, and CPY on the reticle R must entirely consist of a light-shielding layer of, e.g., chromium, and slits of the grating pattern BS or BM must be formed in the light-shielding layer as transparent portions so as to obtain the grating pattern arrangement, as shown in FIG. 5. The same applies to either a positive or negative type resist layer on the photosensitive substrate.

In this embodiment, since the reticle R shown in FIG. 2 is used, 9×9, i.e., a total of 81 overlapping portions, as shown in FIG. 5, are formed at the intervals Sx and Sy in the X and Y directions in a one-shot region (enlarged by $\Delta X'$ and $\Delta Y'$ in practice) transferred onto the photosensitive substrate. Of these overlapping portions, when the relative displacement between the grating patterns BMx and BSx (resist images) in each of the overlapping portions aligned in the X direction with reference to the overlapping portion located at the center of the reticle R (shot center) is measured, the distortion characteristics F(x) in the X-axis direction in the projection view field can be obtained, as shown in FIG. 1. Similarly, when the relative displacement between the grating patterns BMy and BSy (resist images) in each of the overlapping portions aligned in the Y direction with reference to the overlapping portion located at the shot center is measured, distortion characteristics in the Y-axis direction in the projection view field can be obtained.

An example of the detailed dimensions of the grating pattern, the element regions CPA, CPX, and CPY, the intervals Sx, Sy, $\Delta$Tx, and $\Delta$Ty, and the like will be presented below. In the case of a $\times 1/5$ reduction scale, a projection optical system of a stepper of this type has a diameter of about 30 mm on the photosensitive substrate as the projection view field, and the length of one side of a maximum square inscribed by this projection view field is about 21 mm. Thus, when the images of $9\times 9$ pattern groups MP are uniformly aligned in one shot, the intervals Sx/M and Sy/M of the images of the pattern groups MP on the photosensitive substrate MP can be set to be about 2.5 mm.

More specifically, the intervals Sx and Sy on the reticle R can be set to be 12.5 mm. On the other hand, the resist images of the grating patterns BSx, BSy, BMx, and BMy formed on the photosensitive substrate should have a line-and-space pitch of 2 $\mu$m and a line width of about 1 $\mu$m to allow stable transfer. Thus, if the number of lines in the grating pattern is 40, and the length of each line is about 40 $\mu$, the size of one grating pattern on the photosensitive substrate is about $80\times 40$ $\mu$m, and becomes $0.4\times 0.2$ mm on the reticle. In this case, the width Ds shown in FIG. 3 becomes 0.2 mm on the reticle. Thus, when the intervals Xm and Ym in FIG. 3 are set to be 0.3 mm on the reticle, the size of each of the element regions CPA, CPX, and CPY on the reticle is about $1\times 1$ mm square. Therefore, the intervals $\Delta$Tx and $\Delta$Ty, in the X and Y directions, of the grating patterns in the regions CPA, CPX, and CPY need only be 1 mm or more on the reticle, and can be about 1.2 mm even in consideration of the space between adjacent regions. Thus, the total size, on the reticle, of the three regions CPA, CPX, and CPY constituting one pattern group MP falls within a range of $2.2\times 2.2$ mm square, and can be smaller than the one field size of the EB exposure apparatus. The size of the projected image of one pattern group MP is $0.44\times 0.44$ mm square on the photosensitive substrate in a $\times 1/5$ reduction scale, and the occupation area obtained when the image of the pattern group MP is overlap-exposed to be shifted by $\Delta$X' and $\Delta$Y' (0.24 mm), as shown in FIG. 4, falls within a range of $0.68\times 0.68$ mm square on the photosensitive substrate. For this reason, when the overlap-exposed portions (0.68 mm square) shown in FIG. 4 are densely aligned in one shot, the intervals (pitches) in the X and Y directions of the overlapping portion of the images of the three regions CPA, CPX, and CPY, i.e., Sx/M and Sy/M can be set to be about 1 mm. Therefore, the change rate of the distortion amount can be measured at about 1-mm intervals in one shot (projection view field).

Figure 6:
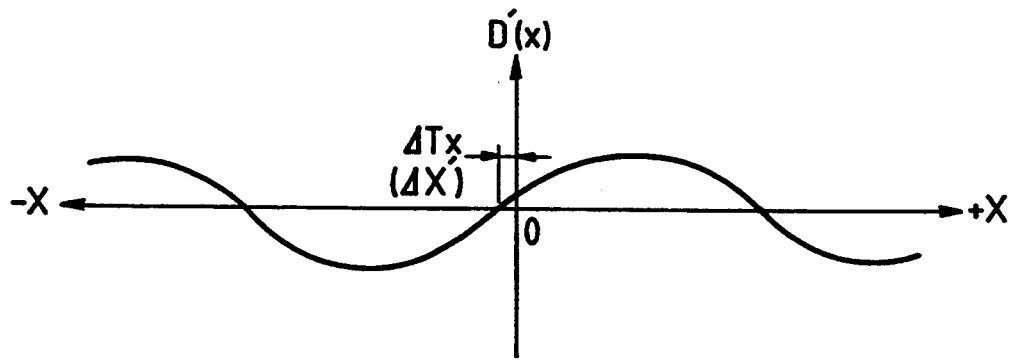
FIG. 6 is a graph showing an example of distortion characteristics.

Since the images of all the pattern groups MP are simultaneously moved by $\Delta$X' and $\Delta$Y' upon relative movement between the reticle R and the photosensitive substrate, the sign of the relative displacement of each measured grating pattern is reversed in the positive and negative directions of the X and Y axes on the two sides of the central point (a point of an image height value=0) of the projection view field. More specifically, when the relative displacement of the grating pattern BSx (BSy) as a sub scale with respect to the grating pattern BMx (BMy) as a main scale is measured, the distortion change rate D'(x) at each point on the X axis passing the center (shot center) of the projection view field has a substantially point-symmetry relationship on the two bides of the point (shot center) where the image height value is zero, as shown in FIG. 6. Note that FIG. 6 shows the envelope of the characteristics shown in FIG. 1C.

The change rate D'(x) assumes a very small value even at the position $x_0$ where the image height value is zero by a shift $\Delta$Tx (or $\Delta$X'). However, since the value $D'(x_0)$ of the change rate at the position $x_0$ can be a constant term appearing on an integral calculation, the distortion amount at the point where the image height value is zero can be normalized to zero by using differences obtained by subtracting $D'(x_0)$ from the values $D'(x_1)$, $D'(x_2)$, ... at other measurement positions $x_1$, $x_2$, ... in a subsequent accumulation calculation or by uniformly subtracting the value $F(x_0)$ from the characteristics shown in FIG. 1D obtained by the accumulation. Thus, it is very significant to arrange one pattern group MP at the central point of the reticle R. The relative displacement between the grating patterns BM and BS obtained by overlap-exposing the pattern group MP at the central position, i.e., the change rate $D'(x_0)$ includes only error amounts (moving errors) between the intervals $\Delta$Tx and $\Delta$Ty determined upon manufacture of the reticle, and the actual relative displacements $\Delta$X' and $\Delta$Y' between the reticle and the photosensitive substrate. In contrast to this, the change rate measured based on the pattern group MP at a position other than the central point includes both the moving errors and the distortion change rate, which are superposed on each other. Therefore, the moving errors can be canceled by the above-mentioned normalization.

When the magnification and direction of a distortion at an arbitrary measurement point in the projection view field are to be obtained, the distortion amount $F(x_n)$ in the X direction and the distortion amount $F(Y_n)$ in the Y direction obtained at that point can be vector-synthesized. In this manner, distortion vectors at a large number of measurement points in the projection view field are calculated by a computer, and are displayed as the lengths and directions of arrows. Thus, the tendency of the distortion characteristics in the projection view field can be visually confirmed as a plane. Of course, the one-dimensional distortion characteristics shown in FIG. 1D may be graphically displayed.

Figure 7:
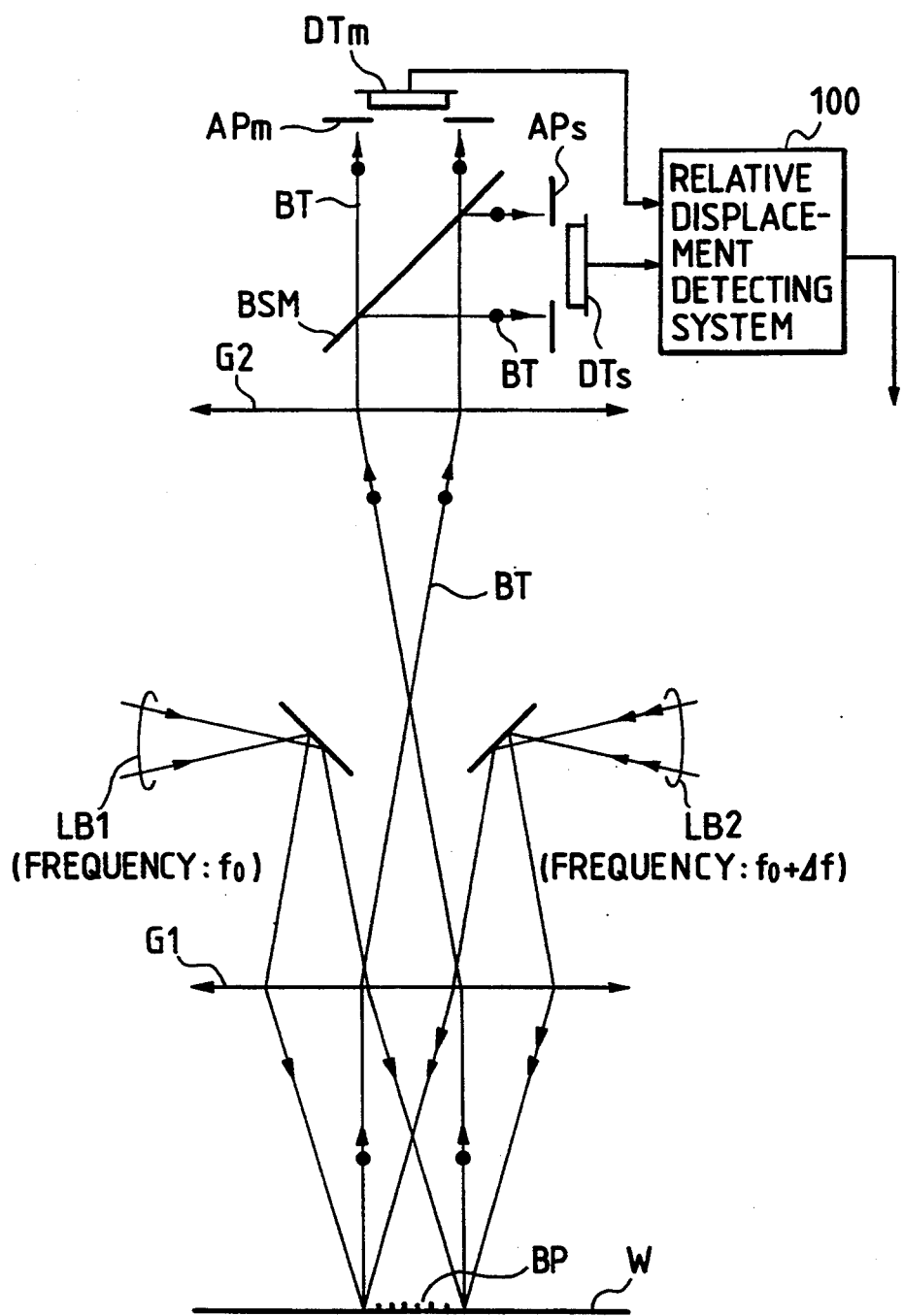
FIG. 7 is a diagram showing an example of an optical measurement means for measuring the pattern shown in FIG. 5.

The relative displacement (caused by a distortion) between the grating patterns BM and BS, as shown in FIG. 5, has a very small value. For this reason, upon measurement of the relative displacement, a measurement sensor having a resolution on the order of namometers is required. FIG. 7 shows an example of a relative displacement detection apparatus which can satisfy such requirements, and the basic arrangement of the apparatus is disclosed in Japanese Laid-Open Patent Application No. 62-56818 (corresponding U.S. Pat. No. 4,710,026). This apparatus will be briefly described below. Referring to FIG. 7, if a pair of grating patterns BMx and BSx on a photosensitive substrate W are represented by BP, two coherent laser beams LB1 and LB2 are collimated via an objective lens G1, and are projected onto the substrate W in a symmetrically inclined state. The inclination direction of the beams LB1 and LB2 coincides with the pitch direction of the grating patterns. At this time, the beams LB1 and LB2 have a predetermined frequency difference $\Delta$f therebetween. The incident angles of the two beams LB1 and LB2 are set, so that diffracted light beams are vertically generated by the grating patterns BP. Diffracted light (1st-order light) vertically generated upon projection of the beam LB1, and diffracted light (1st-order light) vertically generated upon projection of the beam LB2 interfere with each other, and are converted into beat light BT, which is intensity-modulated at the differential frequency Δf. The beat light BT returns to the objective lens G1 and a lens system G2, and is split into two beams by a beam splitter BSM. One of the two split beam is received by a photoelectric sensor DTm via an aperture plate APm, and the other beam is received by a photoelectric sensor DTs via an aperture plate APs. The aperture plates APm and APs are arranged at a position conjugate with the photosensitive substrate W by the objective lens G1 and the lens system G2. The aperture plate APm is formed with an opening for transmitting only the beat light BT from the grating pattern BMx, and the aperture plate APs is formed with an opening for transmitting only the beat light BT from the grating pattern BSx. The photoelectric sensors DTm and DTs output sinusoidal AC signals having the frequency Δf, and the two signals are supplied to a relative displacement detection system 100. Since the two AC signals have a phase difference therebetween in correspondence with the relative displacement, in the X direction, between the grating patterns BMx and BSx, the phase difference is measured by the detection system 100 with high precision. The detection system 100 includes a digital computer, and the like. The system 100 samples the waveforms of the two AC signals, thereafter calculates a phase difference $\phi$ by a Fourier integration method, and converts the phase difference into a relative displacement. Assume that the resolution of the phase difference measurement by the Fourier integration is ±0.72°. In this case, if a pitch Pg of the grating pattern is 2 μm, and 1-st order diffracted light is used as the beat light BT, since the range of ±180° of the phase difference $\phi$ corresponds to ±Pg/4 as a relative displacement, the measurement resolution of the relative displacement is $(\pm Pg/4) \times (0.72/180) = \pm Pg/1,000$, thus yielding ±2 nm. When the incident angles of the beams LB1 and LB2 are set to use 3rd-order diffracted light as the beat light BT, the relative displacement corresponding to the range of ±180° of the phase difference $\phi$ is ⅓ of ±Pg/4, and the measurement resolution becomes as high as ±Pg/3,000.

Figure 8:
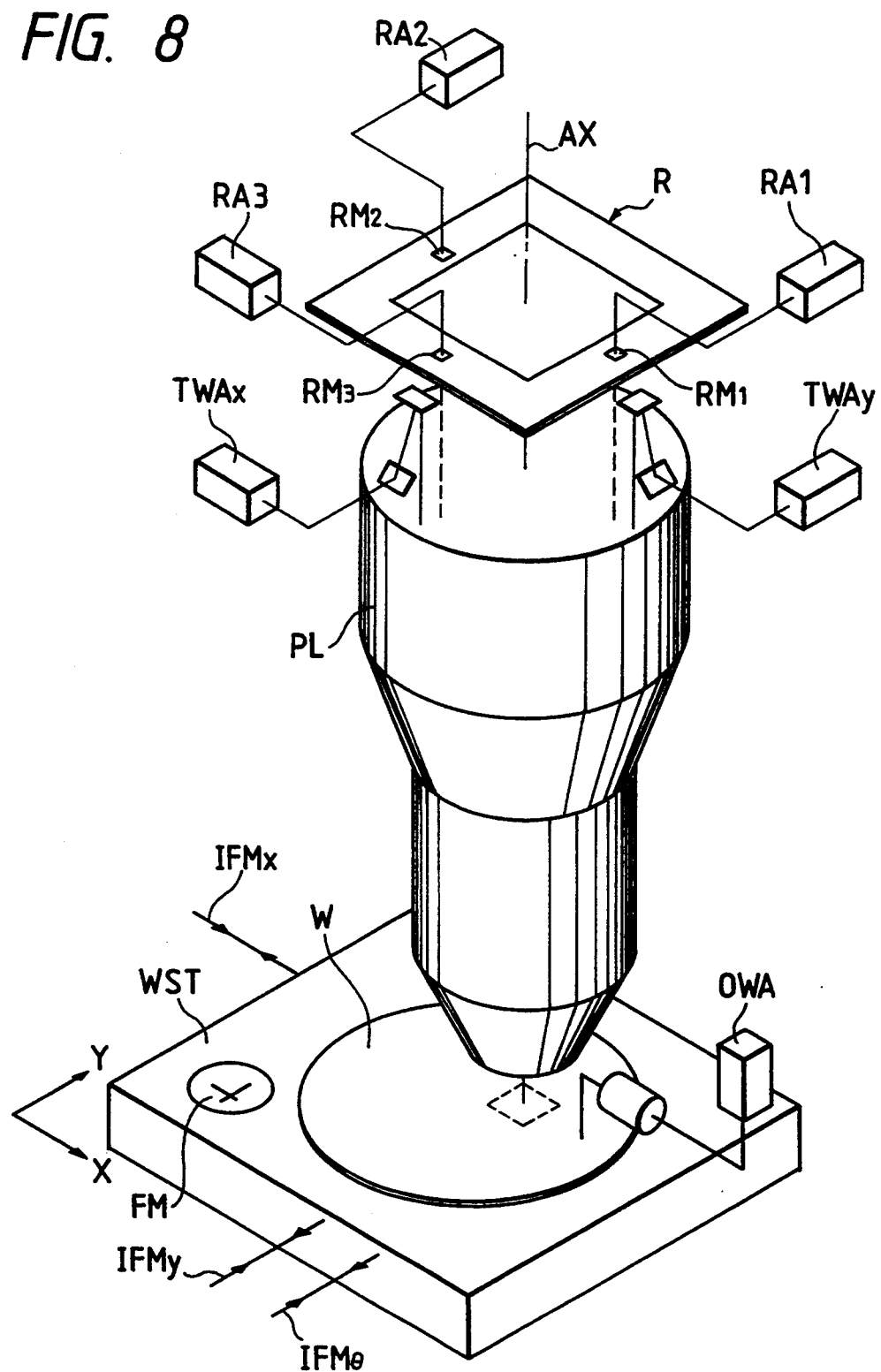
FIG. 8 is a perspective view showing an arrangement of a typical stepper.

FIG. 8 shows a schematic arrangement of a stepper which is subjected to distortion inspection with the reticle R shown in FIG. 2. The reticle R is aligned to an optical axis AX of a projection lens PL by detecting its reticle marks $RM_1$, $RM_2$, and $RM_3$ by reticle alignment systems RA1, RA2, and RA3, respectively. This stepper is provided with TTL alignment systems TWAx and TWAy for detecting the alignment marks, and the like on a wafer W as a photosensitive substrate via only the projection lens PL. Also, an off-axis alignment system OWA for detecting the wafer marks without going through the view field of the projection lens PL is provided. The wafer W is placed on a wafer stage WST, which is two-dimensionally moved in the X and Y directions, and its coordinate position is measured by laser interferometers IFMx, IFMy, and IFMθ. Therefore, when the reticle R and the wafer W are moved relative to each other by ΔX' or ΔY', the drive operation of the wafer stage WST is controlled on the basis of measured length values of the interferometers IFMx and IFMy (or IFMθ).

The relative displacement detection system shown in FIG. 7 can be assembled in the TTL alignment systems TWAx and TWAy or the off-axis alignment system OWA shown in FIG. 8. In this case, if the stepper and a coater-developer are assembled in an inline system, a series of processes from attachment of the reticle R to distortion inspection can be automated, and a function of checking a distortion by the stepper itself, i.e., an automatic self-check function can be achieved.

Figure 9:
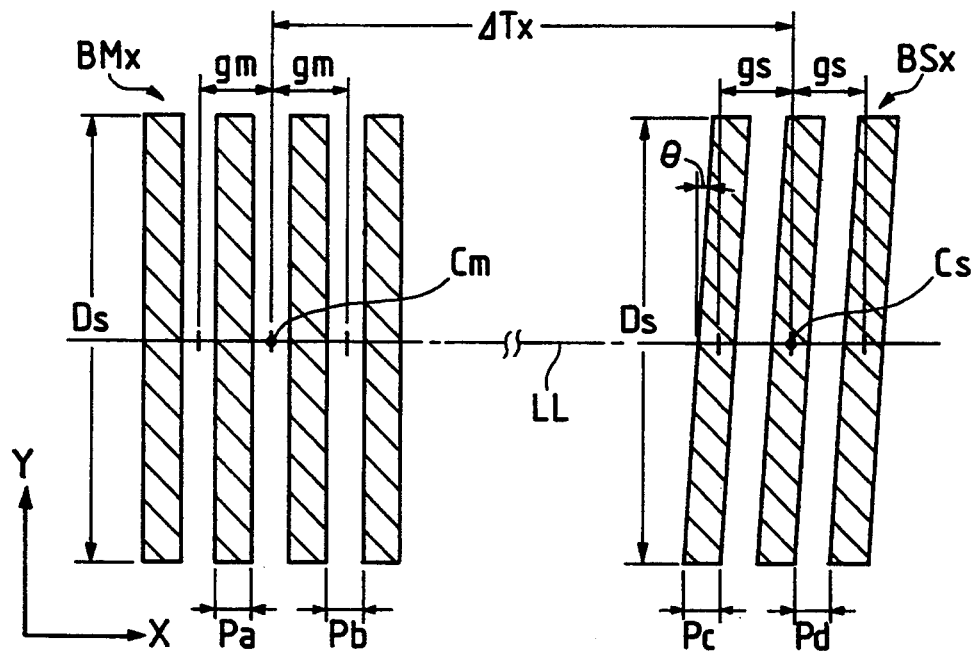
FIG. 9 is a view showing a pattern shape according to the second embodiment of the present invention.

A measurement method according to the second embodiment of the present invention will be described below. This embodiment basically utilizes a technique, as disclosed in Japanese Laid-Open Patent Application No. 2-31142 (corresponding U.S. Pat. No. 4,908,656). FIG. 9 shows a grating pattern BMx as a main vernier and a grating pattern BSx as a sub vernier for the X direction. Central points Cm and Cs of the patterns BMx and BSx are separated by ΔTx in the X direction. In this embodiment, when projected images of the two grating patterns BMx and BSx are overlap-exposed, the central points Cm and Cs are set to almost completely coincide with each other.

In this embodiment, in FIG. 9, lines and spaces of the grating pattern BSx are inclined by $\theta$ from the Y axis. A width Pc of a light-shielding line (latched portion) and a width Pd of a space of the grating pattern BSx respectively correspond to a width PB of a space and a width Pa of a light-shielding line (hatched portion) of the grating pattern BMx. Furthermore, the interval (pitch) of the space portions on a line LL passing the central point of the grating pattern BMx is $g_m$, and the interval (pitch) of the light-shielding lines on the line LL passing the central point of the grating pattern BSx is $g_s$. In this embodiment, for the sake of simplicity, Pa=Pd, Pb=Pc, and $g_m = g_s$. The inclination angle $\theta$ of the lines and spaces of the grating pattern BSx is determined to be a value small enough to allow drawing of the reticle pattern, e.g., about 2° to 3°.

Figure 10:
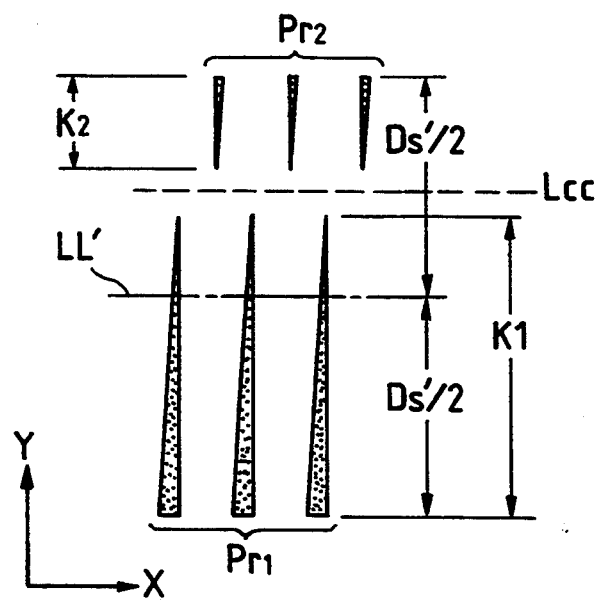
FIG. 10 is a view showing the shape of a resist image obtained according to the second embodiment.

When overlapping exposure is performed onto the wafer W coated with a positive resist layer using the reticle formed with these grating patterns BMx and BSx, and the wafer W is developed, wedge-shaped resist patterns $Pr_1$ and $Pr_2$ appear, as shown in FIG. 10. These wedge-shaped resist patterns $Pr_1$ and $Pr_2$ correspond to non-exposed portions during two exposure processes due to overlapping of the light-shielding lines of the grating patterns BMx and BSx. Lengths $K_1$ and $K_2$, in the Y direction, of the wedge-shaped resist patterns $Pr_1$ and $Pr_2$ become equal to each other when the central points Cm and Cs of the two grating patterns BMx and BSx are overlap-exposed to completely coincide with each other. Note that the vertical angle of a single wedge-shaped resist pattern is $\theta$, and the total length, in the Y direction, of the resist patterns $Pr_1$ and $Pr_2$ becomes Ds' in correspondence with a length Ds of the grating pattern on the reticle. If the value of a projection magnification is represented by M, Ds=M·Ds' is ideally satisfied. However, the length Ds' becomes slightly shorter than the ideal value depending on the exposure amount applied onto the resist layer, development conditions, and the like.

After the resist patterns shown in FIG. 10 are obtained, the total length Ds', in the Y direction, of the wedge-shaped resist patterns $Pr_1$ and $Pr_2$ is measured, and the position of a line LL' for equally dividing the length Ds', i.e., Ds'/2 is calculated Then, lengths $K_1$ and $K_2$, in the Y direction, of the resist patterns $Pr_1$ and $Pr_2$ are measured. In this embodiment, when the central points Cm and Cs of the two grating patterns BMx and BSx perfectly coincide with each other, $K_1 = K_2$ is satisfied. When the actual overlapping position is slightly smaller than ΔTx due to the distortion amount or an error corresponding to the relative displacement $\Delta X'$, $K_1 > K_2$ is satisfied; conversely, when the actual overlapping position is slightly larger than $\Delta Tx$, $K_1 < K_2$ is satisfied. When $K_1 = K_2$, a central line Lcc, in the Y direction, of the resist patterns $Pr_1$ and $Pr_2$ shown in FIG. 10 must coincide with the central line LL' corresponding to $Ds'/2$. An omission region having a width of $Ds' - (K_1 + K_2)$ in the Y direction is present between the resist patterns $Pr_1$ and $Pr_2$.

Thus, the deviation, in the Y direction, of the central line Lcc from the central line LL' is proportional to an alignment error (including an error caused by a distortion) in the X direction upon overlapping of the two grating patterns BMx and BSx. If the deviation, in the Y direction, between the central lines Lcc and LL' is represented by $\Delta Yc$, $\Delta Yc$ is given by:

$$\Delta Yc = (Ds' - (K_1 + K_2))/2 + K_1 - Ds'/2 \tag{1}$$

or $$\Delta Yc = Ds'/2 - (K_2 + (Ds' - (K_1 + K_2))/2) \tag{2}$$

Equation (1) is used when the deviation is calculated from the wedge-shaped resist pattern $Pr_1$ side, and equation (2) is used when the deviation is calculated from the wedge-shaped resist pattern $Pr_2$ side. Equations (1) and (2) can be rewritten as:

$$\Delta Yc = (K_1 - K_2)/2 \tag{3}$$

Furthermore, from the vertical angle $\theta$ of the wedge-shaped resist pattern, if an alignment error, in the X direction, between the two grating patterns BMx and BSx is represented by $\Delta Dx$, $\Delta Dx$ is given by:

$$\Delta Dx \approx \Delta Yc \cdot \sin\theta \tag{4}$$

If the vertical angle $\theta$ is about 3°, the deviation $\Delta Yc$ is obtained as the error amount $\Delta Dx$ in an about $\times 20$ enlargement scale. Therefore, if the measurement resolution of the lengths $K_1$ and $K_2$, in the Y direction, of the wedge-shaped resist patterns $Pr_1$ and $Pr_2$ is about 0.02 μm, it can be converted into an error amount in the X direction, i.e., a resolution of about 1 nm.

Thus, when the grating patterns BMx and BSx are formed on each of the pattern element regions CPA and CPX shown in FIGS. 2 and 3, the distortion amount change rate in the X direction can be measured with high precision as in the first embodiment. Note that the dimensions of the wedge-shaped patterns $Pr_1$ and $Pr_2$ shown in FIG. 10 can be measured using the TTL alignment system TWAx or TWAy, the off-axis alignment system OWA, or the like of the stepper shown in FIG. 8. In this case, by utilizing the periodic structure of the resist patterns $Pr_1$ and $Pr_2$, a method wherein an alignment system for projecting a slit-shaped laser spot onto a wafer W is assembled, and a change in intensity of diffracted light generated by the periodic structure is photoelectrically detected in synchronism with the relative scan between the slit-shaped laser spot and the wafer (resist patterns $Pr_1$ and $Pr_2$) (e.g., disclosed in Japanese Laid-Open Patent Application No. 2-31142 described above) can be adopted.

In this embodiment as well, the wedge-shaped resist patterns $Pr_1$ and $Pr_2$ are caused to appear by development. Alternatively, a latent image, on the resist layer, of an overlapping image of the two grating patterns BMx and BSx, or an image appearing on a photochromic layer may be detected. Alternatively, a photochromic layer may be formed on the surface (having an area equal to or larger than that of the projection view field) of a reference plate FM fixed on the wafer stage WST of the stepper (FIG. 8), the patterns on the reticle may be overlap-exposed on the photochromic layer to form a visual image, and the visual image may be detected by the off-axis alignment system OWA. Note that a technique for projecting and printing a micropattern image on a photochromic layer by ultraviolet rays, observing using an observation microscope if the printed image is good, and erasing the printed image by radiating strong visual light onto the photochromic layer if the printed image is not good is known in Japanese Patent Publication No. 41-10550 (corresponding U.S. Pat. No. 3,260,153), and can be utilized.

In each of the above embodiments, in execution of exposure upon shift by $\Delta X'$ or $\Delta Y'$, the wafer stage WST is moved. Alternatively, the reticle R may be moved. In this case, the reticle R is preferably moved by $\Delta Tx$ and $\Delta Ty$ with relatively high precision using a length measurement device (an encoder, a potentiometer, or a laser interferometer) for measuring the moving position of a reticle stage which holds the reticle R. In the projection view field of a full-field type projection optical system, since identical image height points from the optical axis AX generally have the same distortion amount, the distortion characteristics in the X direction may be examined by only measurement in the X direction. In this case, only two exposure operations are required.

Also, the present invention can be applied to a scan type exposure apparatus for illuminating a reticle with slit-shaped or arcuated illumination light, and performing exposure by scanning the reticle and a wafer relative to each other. The distortion amount measured in this case includes scanning precision.

3. Problems of Basic Differential Method

An embodiment to be described below solves problems in the above-mentioned basic embodiments. The problems of the above embodiments will be described below.

According to the measurement method based on the differential method described in the basic embodiments, the actual interval between the first exposure shot and the second exposure shot, which is exposed after a photosensitive substrate (e.g., a wafer) is moved by $\Delta a$ (corresponding to $\Delta X'$ or $\Delta Y'$) in the measurement direction, is influenced by a stepping error of a wafer stage in a strict sense. More specifically, as described above, when the first shot is used as a reference shot, and the second shot is exposed to be shifted from the first shot by $\Delta a$ in the measurement direction, a measurement reference pattern (main scale corresponding to the patterns BMx and BMy in FIG. 3) exposed in the first shot, and a measurement reference pattern (sub scale corresponding to the patterns BSx and BSy in FIG. 3) exposed in the second shot are arranged on a reticle to have a designed interval therebetween, which interval is converted into a value $\Delta a$ on the photosensitive substrate side.

When the second shot is exposed at a position shifted by $\Delta a$ from the first shot, a relative displacement d between the main and sub scales is measured as a difference in distortion value at that image height point. More specifically, if the actually measured interval between actual main and sub scale images is represented by a, the following relationship is established:

$$d = a - \Delta a$$

However, in this case, if the second shot is exposed at a position shifted by $(\Delta a + \Delta s)$ from the first shot due to a stepping error $\Delta s$ of the stage, an actual distortion measured value d' (corresponding to the distortion change rates D'(x) and D'(y) shown in FIG. 1C) at each measurement point is given by:

$$d' a - (\Delta a + \Delta s) = (a - \Delta a) - \Delta s = d - \Delta s \quad (5)$$

More specifically, the distortion measured value d' undesirably becomes smaller than an original distortion value d by $\Delta s$. For this reason, when this stepping error is not considered, measurement precision is influenced by the stepping error of the stage.

Furthermore, in the differential method, a distortion difference $d_1$ between the reference position and the first measurement position, a distortion difference $d_2$ between the first and second measurement positions, ..., a distortion difference $d_i$ between the (i-1)-th and i-th measurement positions are obtained, and an accumulated value of these distortion differences is used as a distortion value $D_i$ (corresponding to the distortion characteristics F(x) in FIG. 1D) at the i-th measurement position. Therefore, if the stepping error $\Delta s$ is present, actually measured values $d_1', d_2', \ldots d_i'$ corresponding to the distortion differences $d_1, d_2, \ldots, d_i$ are given by:

$$d_1' = d_1 - \Delta s, \; d_2' = d_2 - \Delta s, \ldots, d_i' = d_i - \Delta s \quad (6)$$

The distortion value $D_i$ at the i-th measurement position is given by:

$$D_i = d_1 + d_2 + \ldots + d_i \quad (7)$$

Therefore, a measured value $D_i'$ corresponding to the distortion value $D_i$ is given by:

$$\begin{aligned} D_i' &= d_1' + d_2' + \ldots + d_i' \\ &= (d_1 - \Delta s) + (d_2 - \Delta s) + \ldots + (d_i - \Delta s) \\ &= D_i - i \times \Delta s \end{aligned} \quad (8)$$

As can be seen from the above description, the stepping error increases as the distortion differences from the reference position are added to each other. More specifically, the stepping error remains even when the distortion characteristics are calculated using only the basic equation of the differential method:

$$D_i' = \left\{ \sum_{k=0}^{i} dk' \right\} Sx/\Delta a \quad (9)$$

In order to solve this problem, the following method may be proposed. That is, in this method, the interval between specific patterns in an exposure field is used as a reference interval, a difference between this interval and a designed value is calculated, and the distortion measured value is corrected using the difference as the stepping error of the stage. For example, it can be considered that the distortion measured value $d_i'$ between the reference position and the first measurement position is difference from the true value $d_i$ by the stepping error $\Delta s$. However, when the true value $d_1$ of the first measurement position is not corrected, i.e., when a distortion measured value $d_1''$ after the first measurement position is corrected is assumed to be $\Delta s$, since the respective actual distortion values $d_i'$ are given by equation (3), if the stepping error $\Delta s$ is corrected as $d_i'$, corrected distortion measured values $d_1'', d_2'', \ldots, d_i''$ are given by:

$$d_1'' = \Delta s, \; d_2'' = d_2 - d_i'' = d_i - d_1 \quad (10)$$

Therefore, a corrected distortion measured value $D_i''$ at the i-th measurement position is given as follows with respect to the true value $D_i$:

$$D_i'' = D_i + (i-1) \times d_1 \quad (11)$$

More specifically, in this case, the distortion difference $d_1$ at the two end of the reference interval influences the distortion value at another measurement position as a calibration error.

With this differential method, although the distortion difference in a specific direction (e.g., the X direction) can be measured from a combination of the first and second shots, the distortion difference in another direction (e.g., the Y direction) cannot be simultaneously measured. For this reason, when a rotation error amount between the first and second shots for measurement in the first direction is different from a rotation error amount between the first and second shots for measurement in the second direction, a measurement error caused by the rotation error amount difference occurs.

Figure 11:
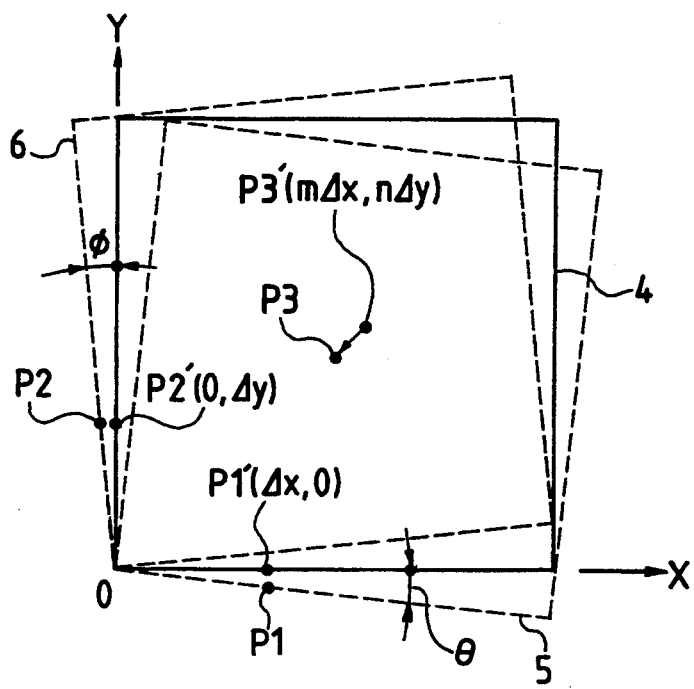
FIG. 11 is an explanatory view of a rotation error in a distortion characteristic inspection method based on a basic differential method.

For example, in FIG. 11, assume that a grating-shaped measurement pattern is projected in a shot region 4 in the first exposure process, and measurement points $P_1'$ ($\Delta x$, 0) and $P_2'$(0, $\Delta y$) separated by one step in the X and Y directions from the origin O as the reference position will be examined below. Upon execution of the second exposure processing after stepping by $\Delta x$ and $\Delta y$ in the X and Y directions, assume that, due to yawing (swing) of the stage or the like, a shot region 5, which is rotated clockwise by an angle $\theta$ from the shot region 4 upon stepping in the X direction, is exposed, and a shot region 6, which is rotated counterclockwise by an angle $\phi$ from the shot region 4 upon execution of stepping in the Y direction, is exposed. In this case, upon rotation of the shots, the ideal grating point $P_1'$ ($\Delta x$, 0) in the X direction moves to a point P1 having coordinates ($\Delta x \cdot \cos\theta$, $-\Delta x \cdot \sin\theta$), and the ideal grating point $P_2'$ (0, $\theta y$) in the Y direction moves to a point P2 having coordinates ($\Delta y \cdot \sin\theta$, $\Delta y \cdot \cos\phi$).

Therefore, it is considered that an arbitrary measurement point $P_3'$ ($m\Delta x$, $n\Delta y$) moves to a point P3 having coordinates (dx, dy) upon rotation of the second shot, and dx and dy are respectively given by:

$$dx = m \cdot \Delta x \cdot \cos\theta + n \cdot \Delta y \cdot \sin\phi \quad (12)$$

$$dy = n \cdot \Delta y \cdot \cos\phi - m \cdot \Delta x \cdot \sin\theta \quad (13)$$

A square of a distance r between the reference point (0, 0) and the measurement point $P_3'$ ($m\Delta x$, $n\Delta y$) is given by:

$$r^2 = m^2 \Delta x^2 + n^2 \Delta y^2 \quad (14)$$

In contrast to this, a square of a distance R between the reference point (0, 0) and the rotated point P3 having the coordinates (dx, dy) is given by:

$$\begin{aligned}R^2 &= (m \cdot \Delta x \cdot \cos\theta + n \cdot \Delta y \cdot \sin\phi)^2 + \\ &\quad (n \cdot \Delta y \cdot \cos\phi - m \cdot \Delta x \cdot \sin\theta)^2 \\ &= (m \cdot \Delta x)^2 + (n \cdot \Delta y)^2 + \\ &\quad (m \cdot \Delta x) \cdot (n \cdot \Delta y) \cdot (\cos\theta\sin\phi - \cos\phi\sin\theta) \\ &= (m \cdot \Delta x)^2 + (n \cdot \Delta y)^2 + \\ &\quad (m \cdot \Delta x) \cdot (n \cdot \Delta y) \cdot \sin(\phi - \theta)\end{aligned} \quad (15)$$

As can be seen from comparison between equations (9) and (10), when the angle $\theta$ is different from the angle $\phi$, the original distance r does not coincide with the measured distance R, i.e., a magnification error is generated.

Thus, in a differential method wherein a distortion value difference between adjacent positions is calculated, and an accumulated value of distortion value differences from the reference position in the exposure field of a projection optical system to a certain measurement position is determined as a distortion value at the measurement position, the improved embodiment can provide a method which can satisfactorily correct a stepping error (stepping correction error), and can quickly obtain a precise distortion measurement result, and a method which can satisfactorily correct a magnification error caused by a difference between rotation errors of shots having different measurement directions, and can quickly obtain a precise distortion measurement result.

4. Principle of Improved Embodiment

Figure 13:
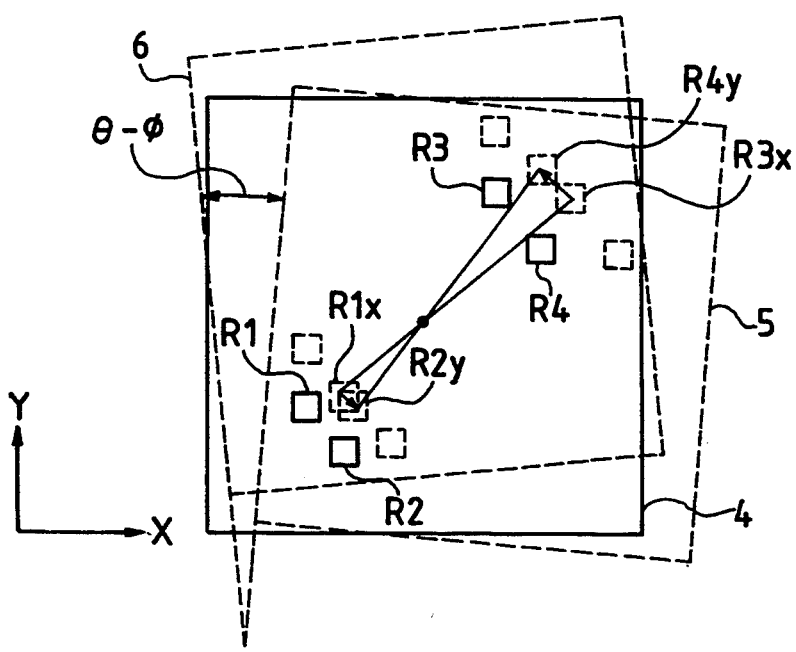
FIG. 13 is an explanatory view of the principle for explaining a method of obtaining a rotation error in the third embodiment.

The principle of correcting a magnification error caused by a stepping error and a rotation error will be described below with reference to FIGS. 12A to 13.

Figure 12A:
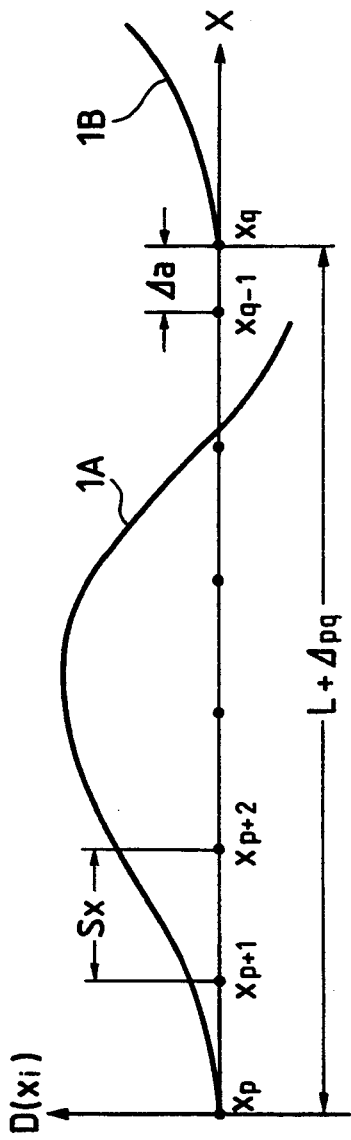
FIGS. 12A, 12B, and 12C are respectively a graph showing an example of distortion characteristics, a graph showing the overlapping distortion characteristics which are shifted in the X direction, and a graph showing a distortion differential value so as to explain the principle of the improved third embodiment.

For the sake of simplicity, assume that the first measurement direction in the exposure field of the projection optical system is defined as the X direction, and a difference $D_{pq}$ between distortion values $D(x_i)$ corresponding to a curve 1A between p-th and q-th measurement points $x_p$ and $x_q$ in the X direction is calculated, as shown in FIG. 12A. The q-th measurement point $x_q$ is obtained by exposing the first main measurement mark of the p-th measurement point $x_p$ by moving a photosensitive substrate by a distance L (added with a stepping error $\Delta_{pq}$ in practice) in the X direction. The distance L is determined so that a difference, in the X direction between the (q-1)-th and q-th measurement points becomes equal to $\Delta a$ as the step amount in the X direction. Therefore, a characteristic curve 1B on the right side of the q-th measurement point $x_q$ is obtained by translating the curve 1A. More specifically, when the measurement point $x_p$ is defined as a projection optical axis, the measurement point $x_q$ is present outside the exposure field.

Figure 12B:
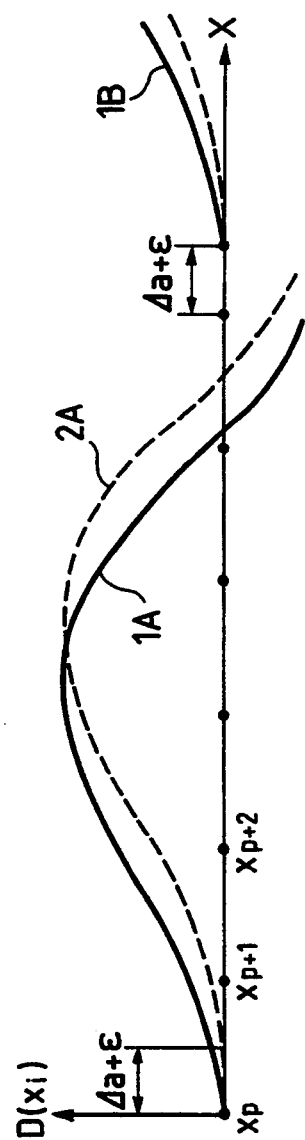

In this case, the stepping error (or stepping correction error) as the first object is corrected as follows. That is, when the photosensitive substrate is moved by $\Delta a$ in the X direction, and an image on a mask is exposed, an image having a distortion value corresponding to a curve 2A obtained by moving the curve 1A by $\Delta a$ (added with a stepping error $\epsilon$ in a strict sense) in the X direction is exposed, as shown in FIG. 12B. $\Delta a$ is an original interval between the image of the first main measurement mark (corresponding to BMx and BMy in FIG. 3) and the image of the first sub measurement mark (corresponding to BSx and BSy in FIG. 3), and corresponds to the interval $\Delta Tx$ ($\Delta Ty$) in the embodiment shown in FIGS. 1A to 5.

Figure 12C:
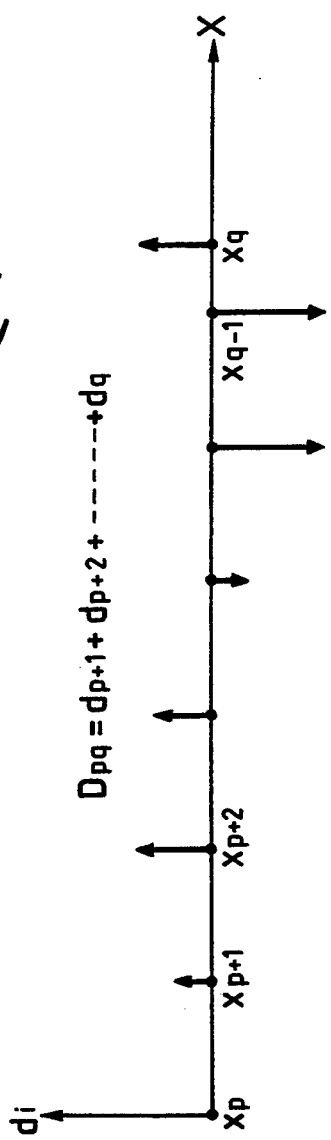

Then, distortion value differences (distortion differential values) $d_{(p+1)}$, $d_{(p+2)}$, ..., $d_q$ between the p-th and (p+1)-th measurement positions, between the (p+1)-th and (p+2)-th measurement positions, ..., between the (q-1)-th and q-th measurement positions are calculated, as shown in FIG. 12C. Therefore, the distortion value difference $D_{pq}$ between the p-th and q-th measurement points is calculated as follows:

$$D_{pq} = d_{(p+1)} + d_{(p+2)} + \ldots + d_q \quad (16)$$

When the first main measurement mark located at the p-th measurement point $x_p$ is exposed at the q-th measurement point $x_q$, the moving distance L is precisely measured using, e.g., a laser interferometer, thereby measuring the stepping error $\Delta_{pq}$. The error $\Delta_{pq}$ is also measured by exposing the measurement points $x_p$ and $x_q$ to overlap each other, and measuring a relative displacement therebetween. If the error $\Delta_{pq}$ is defined as a true value, since the stepping error $\epsilon$ in the differential method satisfies the relation $D_{pq} + (\overline{q-p})\epsilon = \Delta_{pq}$ (where $\overline{q-q}$ is the distance between the points $x_p$ and $x_q$), the error $\epsilon$ is given by:

$$\epsilon = (\Delta_{pq} - D_{pq})/(\overline{q-p}) \quad (17)$$

Therefore, a value $d_i'$, after stepping error correction, of a measured value $d_i$ of the distortion differential value between the i-th and (i+1)-th measurement points is given by:

$$d_i' = d_i + \epsilon = d_i + (\Delta_{pq} - D_{pq})/(\overline{q-p}) \quad (18)$$

Upon calculation of the error $\Delta_{pq}$, when stepping exposure is performed so that the p-th and q-th measurement points $x_p$ and $x_q$ overlap each other, the influence of the stepping error can be reduced using an averaging effect by exposing and measuring a large number of shots. On the other hand, when the distance between the p-th and q-th measurement points is directly calculated, the same effect can be obtained by increasing the number of times of measurement. Also, in the second measurement direction (e.g., Y direction), the calculation of the distortion value, and correction of the stepping error are similarly performed by the differential method.

A method of eliminating the influence of a difference between rotation errors in units of shots depending on measurement directions as the second drawback described above will be described below with reference to FIG. 13. When the first projected image of a mask formed with measurement marks is defined as a shot region 4, a rotation error of a shot region 5 obtained by exposing the mask image by shifting a photosensitive substrate by $\Delta a$ (corresponding to $\Delta Tx$ in FIGS. 1A to 5) in the X direction is defined as an angle $\theta$, and a rotation error of a shot region 6 obtained by exposing the mask image by shifting the photosensitive substrate by $\Delta b$ (corresponding to $\Delta Ty$ in FIGS. 1A to 5) in the Y direction is defined as an angle $\phi$, the rotation error between the shot regions 5 and 6 is an angle $(\theta - \phi)$.

In this case, in this embodiment, the rotation error of the shot region 6 is adjusted to that of the shot region 5, or vice versa. For this purpose, for example, measurement marks for measuring a rotation error are formed on the mask, as indicated by measurement mark images R1, R2, R3, and R4. The measurement mark image R1 becomes a measurement mark image R1x in the shot region 5, the measurement mark image R2 becomes a measurement mark image R2y in the shot region 6, the measurement mark image R3 becomes a measurement mark image R3x in the shot region 5, and the measurement mark image R4 becomes a measurement mark image R4y in the shot region 6. When the rotation error $(\theta-\phi)=0$, the measurement mark images R1x and R2y coincide with each other, and the measurement mark images R3x and R4y coincide with each other.

Thus, the rotation error $(\theta-\phi)$ is calculated based on the relative displacement between the measurement mark images R1x and R2y, and the relative displacement between the measurement mark images R3x and R4y. Then, for example, the distortion differential value in the Y direction obtained from the relative displacement between the shot regions 6 and 4 is corrected for the rotation error $(\theta-\phi)$. This correction is equivalent to adjustment of the rotation state of the shot region 6 to that of the shot region 5. With this correction, the error of the distortion (e.g., a magnification error) value caused by the rotation error $(\theta-\phi)$ is eliminated. Although the measurement result of the distortion value is rotated in correspondence with the shot region 5, this simple rotation is normally corrected as rotation of a reticle.

This will be explained in a pure general fashion below. The second shot for the first measurement direction (X direction), and the second shot for the second measurement direction (Y direction) are exposed to partially overlap each other, and overlapping errors $(\Delta u_1, \Delta u_2)$ and $(\Delta v_1, \Delta v_2)$ of these two shots are calculated at two points U $(u_1, u_2)$ and V $(v_1, v_2)$ on the first reference shot. A rotation error $\Delta\theta$ between the shot regions 5 and 6 upon movement in the first and second measurement directions is calculated using the following equation:

$$\Delta\theta = \frac{\sqrt{(\Delta v_1 - \Delta u_1)^2 + (\Delta v_2 - \Delta u_2)^2}}{\sqrt{(v_1 - u_1)^2 + (v_2 - u_2)^2}} \quad (19)$$

When the second measurement direction is expressed by a direction cosine $(w_1, w_2)$, a position error $(\Delta rx, \Delta ry)$ caused by the rotation error of the shot region obtained by exposing the pattern by shifting the substrate in the second measurement direction with respect to the shot region obtained by exposing the pattern by shifting the substrate in the first measurement direction is given by:

$$\Delta rx = w_1 \cdot \cos\Delta\theta - w_2 \cdot \sin\Delta\theta \quad (20)$$

$$\Delta ry = w_1 \cdot \sin\Delta\theta + w_2 \cdot \cos\Delta\theta \quad (21)$$

Therefore, if the distortion differential value in the second measurement position at that position is $(d_1, d_2)$, this differential value is subjected to rotation error correction of the angle $\Delta\theta$ for this differential value, and a corrected distortion differential value $(d_1', d_2')$ is obtained as follows:

$$d_1' = d_1 - \Delta rx = d_1 - w_1 \cdot \cos\Delta\theta + w_2 \cdot \sin\Delta\theta \quad (22)$$

$$d_1' = d_2 - \Delta ry = d_2 - w_1 \cdot \sin\Delta\theta - w_2 \cdot \cos\Delta\theta \quad (23)$$

When a total sum of distortion differential values at the respective measurement points from the reference position is calculated using the above-mentioned value as the distortion differential value in the second measurement direction, the rotation error can be corrected.

To summarize the above description, as for a stepping error, if the distortion value of a certain point at the end of the exposure field is obtained as a sum of m distortion differential values, the stepping error $\epsilon$ in the differential method influences an error of $m \times \epsilon$ at the point at the end of the exposure field. In order to reduce this influence by averaging it in N shot exposure processes and N measurement processes, (the number of measurement points per shot)×(the number of measurement shots) measurement processes are required.

In contrast to this, in the method of calculating the distortion difference $D_{pq}$ between two predetermined measurement points, measurement processes corresponding to the number of measurements shots for averaging need only be added. If the measurement reproducibility in measurement is smaller than the stepping error, the total number of measurement marks required for obtaining given precision can be reduced as compared to the basic differential method.

As for a magnification error caused by the rotation error, the measured value in one direction (e.g., the Y direction) is corrected for the position error $(\Delta rx, \Delta ry)$ caused by rotation. Since a relative rotation error between a shot region in one measurement direction and a shot region in the other measurement direction is corrected in advance under the assumption that the rotation error $\Delta\theta$ is an angle $(\theta-\phi)$, it can be considered that the shot regions in the two measurement directions are rotated by the same amount in the same direction in the absolute coordinate system, thus causing no magnification error.

5. Detailed Procedure of Improved Embodiment

An example of a distortion inspection method for a projection optical system according to this embodiment will be described below with reference to the accompanying drawings. This embodiment is applied to a case wherein the distortion characteristics of a projection optical system are measured in a projection exposure apparatus (stepper) for transferring a pattern on a reticle onto a wafer via the projection optical system by a step-and-repeat method.

Figure 14:
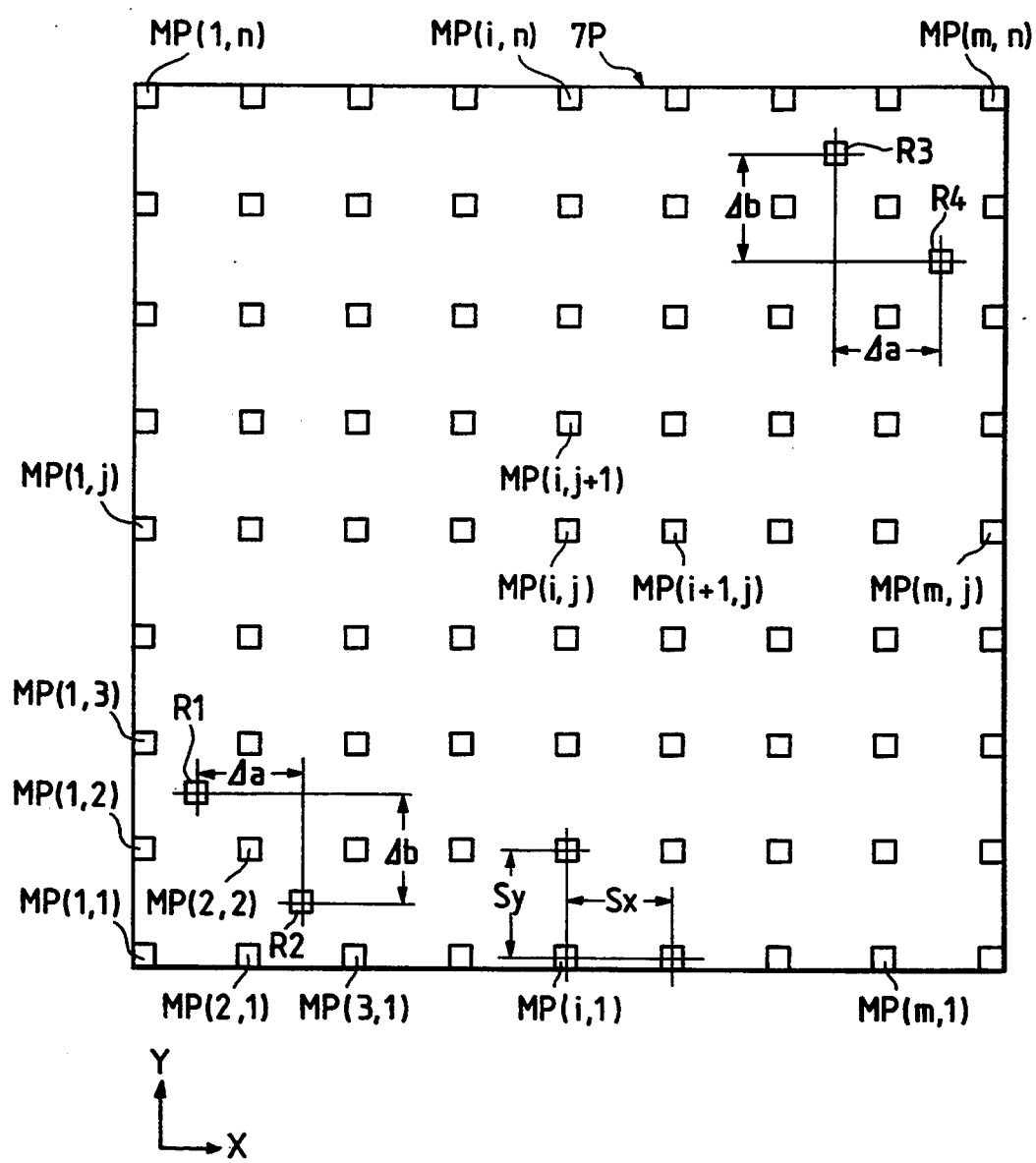
FIG. 14 is a plan view showing a projected image of a test reticle used in the third embodiment.

FIG. 14 shows a projected image of a test reticle used in this embodiment onto a wafer. Referring to FIG. 14, images MP(i, j) (i=1, 2, ..., m; j=1, 2, ..., n) of measurement mark groups are aligned on a test reticle image 7P in a matrix at pitches Sx and Sy in the X and Y directions. On the test reticle image 7P, images R1 and R2 of two rotation measurement mark groups are aligned in a diagonal direction of a measurement mark image MP(2, 2), and images R3 and R4 of two rotation measurement mark groups are aligned in a diagonal direction of a measurement mark image MP (m−1, n−1). The rotation measurement mark images R1 and R2 are arranged to be separated by $\Delta a$ and $\Delta b$ in the X and Y directions, and the rotation measurement mark images R3 and R4 are arranged to be separated by $\Delta a$ and $\Delta b$ in the X and Y directions. Note that the intervals Sx and Sy are different from the intervals $\Delta a$ and $\Delta b$.

Figure 15A:
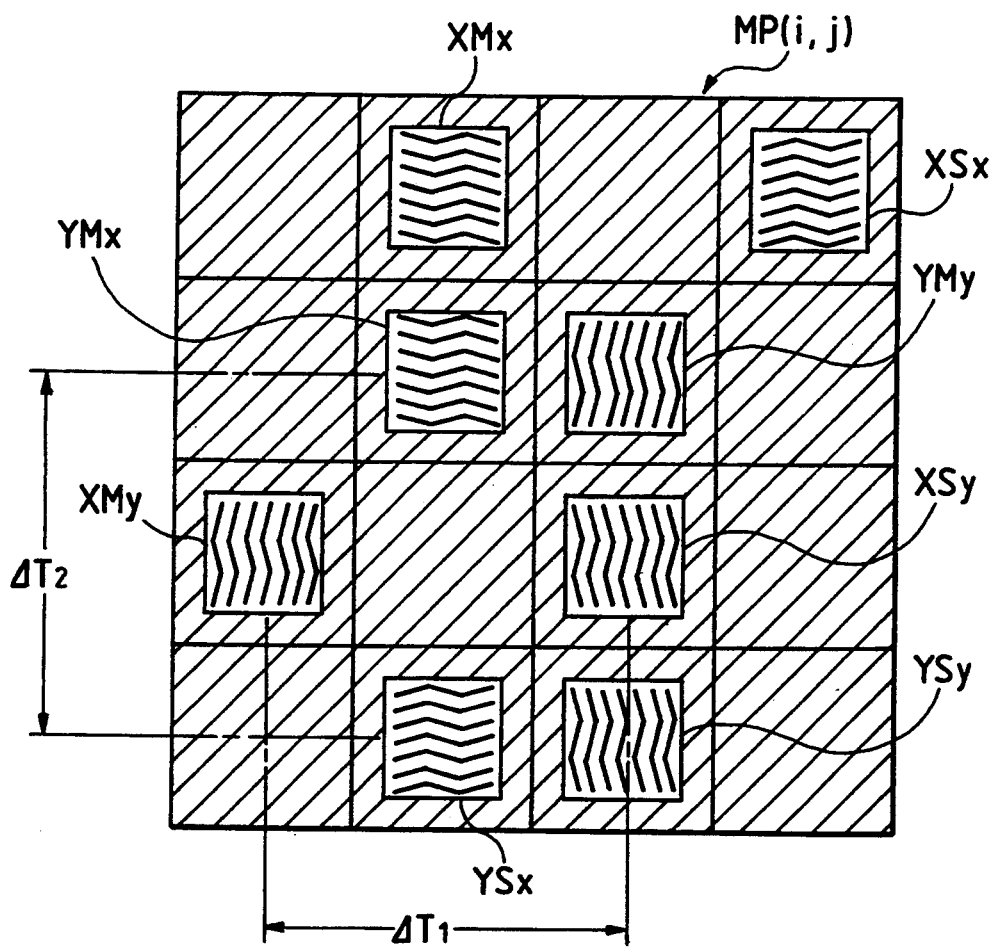
FIGS. 15A, 15B, and 15C are enlarged views respectively showing a measurement mark image MP (i, j) in the test reticle image shown in FIG. 14, and the mark images R1 and R2 used for measuring rotation in the test reticle image.

Each measurement mark image MP(i, j) is divided into 4 × 4 blocks, as shown in FIG. 15A. Of these blocks, fiducial mark images XMx and XMy for measuring a difference in the X direction, reference mark images XSx and XSy for measuring a difference in the X direction, fiducial mark images YMx and YMy for measuring a difference in the Y direction, and reference mark images YSx and YSy for measuring a difference in the Y direction are aligned on the eight blocks, and the remaining eight hatched blocks are formed as light-shielding portions. As shown in FIG. 16, each of the fiducial mark images XMx and YMx is defined by polygonal line-shaped mark images 8, which cross the X direction at an angle δ, each of the reference mark images XSx and YSx is defined by mark images obtained by inverting the mark images 8 shown in FIG. 16 about the X axis, each of the fiducial mark images XMy and YMy is defined by mark images obtained by rotating the mark images 8 in FIG. 16 through 90°, and each of the reference mark images XSy and YSy is defined by mark images obtained by inverting the fiducial mark image XMy or YMy about the Y axis. The interval, in the Y direction, between the fiducial mark image YMx and the reference mark image YSx is determined to be $\Delta T_2$, the interval, in the X direction, between the fiducial mark image XMy and the reference mark image XSy is determined to be $\Delta T_1$, and the relationship between other fiducial and reference mark images is also similarly determined.

In this case, when the measurement mark image MP(i, j) is moved in the X direction by $\Delta a$ as the step amount upon execution of the differential method in a state free from any aberrations including a distortion in FIG. 15A, the reference mark images XSx and XSy for the X direction of the measurement mark image M(i, j) respectively overlap the fiducial mark images XMx and XMy for the X direction of a neighboring measurement mark image MP(i+1, j). Also, when the measurement mark image M(i, j) is moved in the Y direction by $\Delta b$ as the step amount upon execution of the differential method, the fiducial mark images YMx and YMy for the Y direction of the measurement mark image M(i, j) respectively overlap the reference mark images YSx and YSy for the Y direction of a neighboring measurement mark image M(i, j+1). More specifically, in this embodiment, in place of moving an image so that a fiducial mark and a reference mark present in a single measurement mark group image MP overlap each other, the marks in two mark group images are caused to overlap each other. For this reason, the moving amounts (intervals) $\Delta a$ and $\Delta b$ are determined to satisfy $\Delta a = Sx - \Delta T_1$ and $\Delta b = Sy - \Delta T_2$.

Figure 15B:
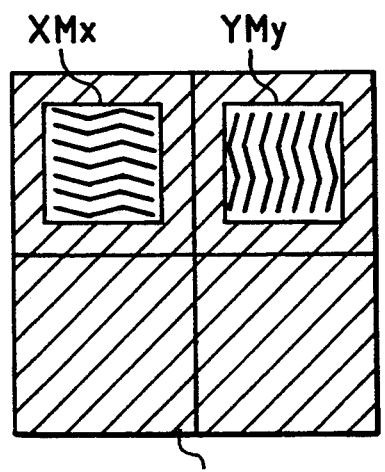
Figure 15C:
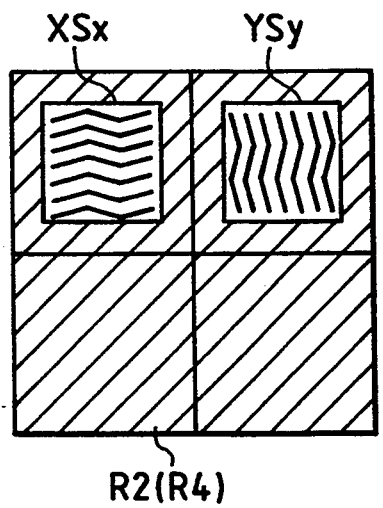

On the other hand, each of the rotation measurement mark images R1 and R3 in FIG. 14 is formed to include the same marks as the fiducial mark images XMx and YMy which marks are located at two positions in 2×2 blocks, as shown in FIG. 15B, and each of the rotation measurement mark images R2 and R4 is formed to include the same marks as the reference mark images XSx and YSy, as shown in FIG. 15C. In this case, when the rotation measurement mark image R1 (or R3) is moved by $\Delta a$ in the X direction, and the rotation measurement mark image R2 (or R4) is moved by $\Delta b$ in the Y direction, the reference mark images XSx and YSy of the rotation measurement mark image R2 (or R4) respectively overlap the fiducial mark images XMx and YMy of the rotation measurement mark image R1 (R3).

A method of measuring a relative displacement using the polygonal line-shaped mark images 8 in FIG. 16 will be described below with reference to FIGS. 17A and 17B. For example, upon execution of measurement of the relative displacement in the Y direction, as shown in FIG. 17A, the mark images 8 are exposed as fiducial mark images, and mark images 9 (an image obtained by inverting the mark image 8 about the X axis) are exposed as reference mark images. If the mark images 8 and 9 are defined by dark portions, and a resist layer on a wafer is of positive type, rhombic mark images 10 are left in a matrix shape on the wafer. When a slit-shaped spot beam 11 extending in the Y direction is projected from an alignment system of the stepper shown in FIG. 8 onto these rhombic mark images 10 and is scanned in the X direction, and light reflected by these marks is received, a photoelectric signal S is obtained, as shown in FIG. 17B. When the peak positions, in the X direction, of this signal S are obtained by waveform analysis, intervals L1 and L2 between the adjacent mark images 10 are obtained. The difference between these two intervals L1 and L2 corresponds to an enlarged one of the relative displacement, in the Y direction, between, the fiducial and reference mark images 8 and 9 in the X direction in an enlarged scale corresponding to a reciprocal number multiple of the sinusoidal value of the angle δ.

Therefore, when the polygonal line-shaped mark images 8 shown in FIG. 16 and mark images obtained by inverting these mark images about the X axis are used, the relative displacement in the Y direction can be measured with high precision; when mark images obtained by rotating the mark images 8 through 90° and mark images obtained by inverting these mark images about the Y axis are used, the relative displacement in the X direction can be measured with high precision. Since the rotation measurement mark images R1 and R2 are formed with mark images in the two directions, the relative displacements in the X and Y directions can be measured by causing these rotation measurement mark images R1 and R2 to overlap each other. The same applies to the rotation measurement mark images R3 and R4. The detailed relative displacement measurement method using the polygonal line-shaped mark images 8 shown in FIG. 16 is disclosed in Japanese Laid-Open Patent Application No. 4-209518 (U.S. patent application Ser. No. 984,558 filed on Dec. 2, 1992).

Note that, in FIG. 15A, the fiducial mark images for measuring a difference in the X direction consist of the mark images XMx and XMy in the two directions, and the reference mark images for measuring a difference in the X direction also consist of the mark images XSx and XSy in the two directions. Therefore, when the test reticle image is projected to be laterally shifted from the test reticle image 7P (FIG. 14) by a predetermined amount in the X direction, and a distortion differential value in the X direction is calculated, the Y component of the differential value can be obtained as well as the X component of the differential value. This is to obtain the Y component of the differential value so as to obtain distortion characteristics in an arbitrary direction with high precision in consideration of, e.g., a case wherein the measurement direction does not always coincide with the X or Y axis. Therefore, when the measurement direction coincides with the X direction, and detection precision of the distortion characteristics is relatively low, the Y component of the differential value may be ignored. The fiducial and reference mark images for measuring a difference in the Y direction also consist of the mark images in the two directions for the same reason as described above.

A distortion characteristic measurement method of this embodiment will be described below with reference to the flow chart in FIG. 18.

Figure 18:
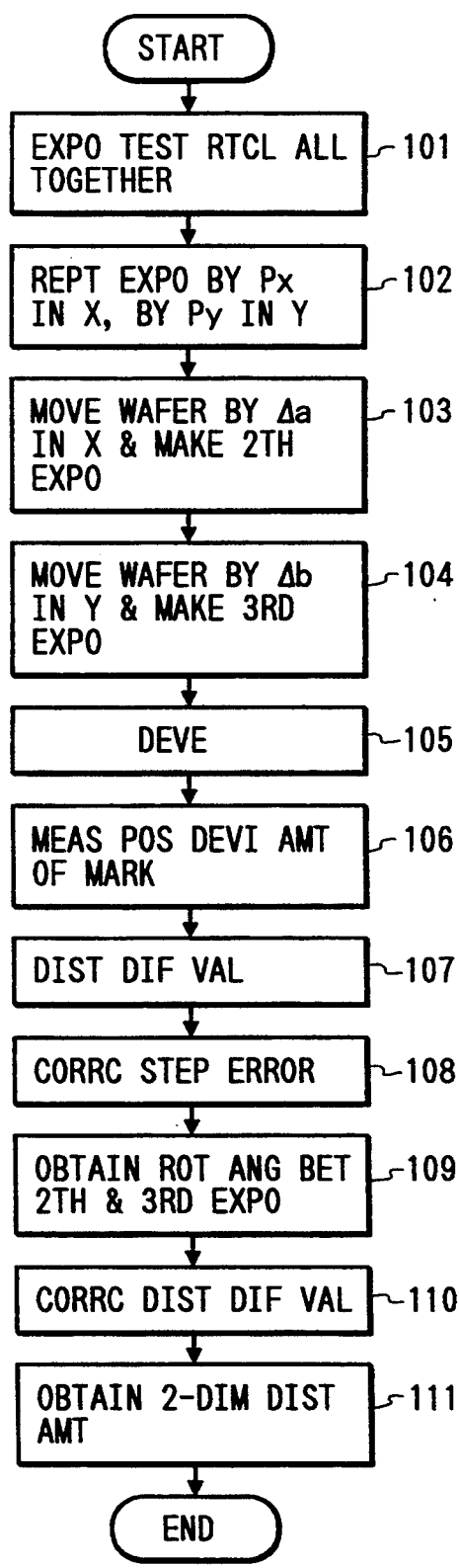
FIG. 18 is a flow chart showing a distortion inspection method of a projection optical system according to the third embodiment.
Figure 19:
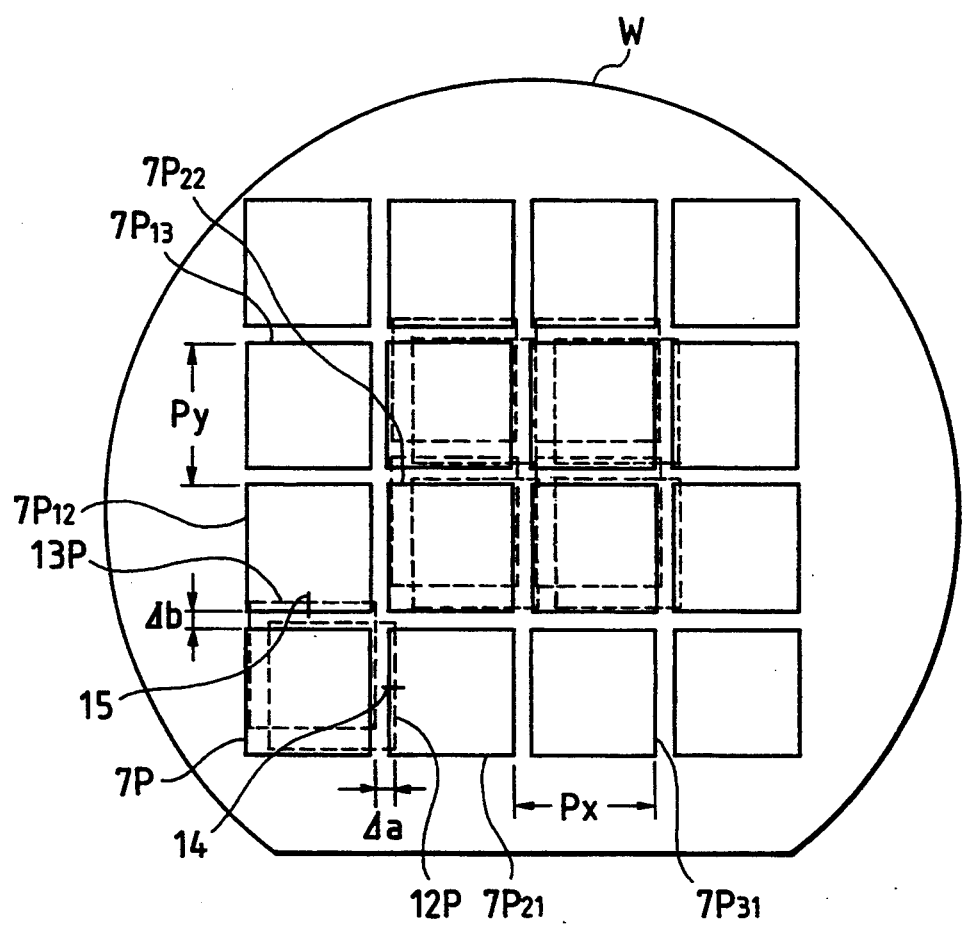
FIG. 19 is a plan view showing an arrangement of shots exposed onto a wafer in the third embodiment.
Figure 20:
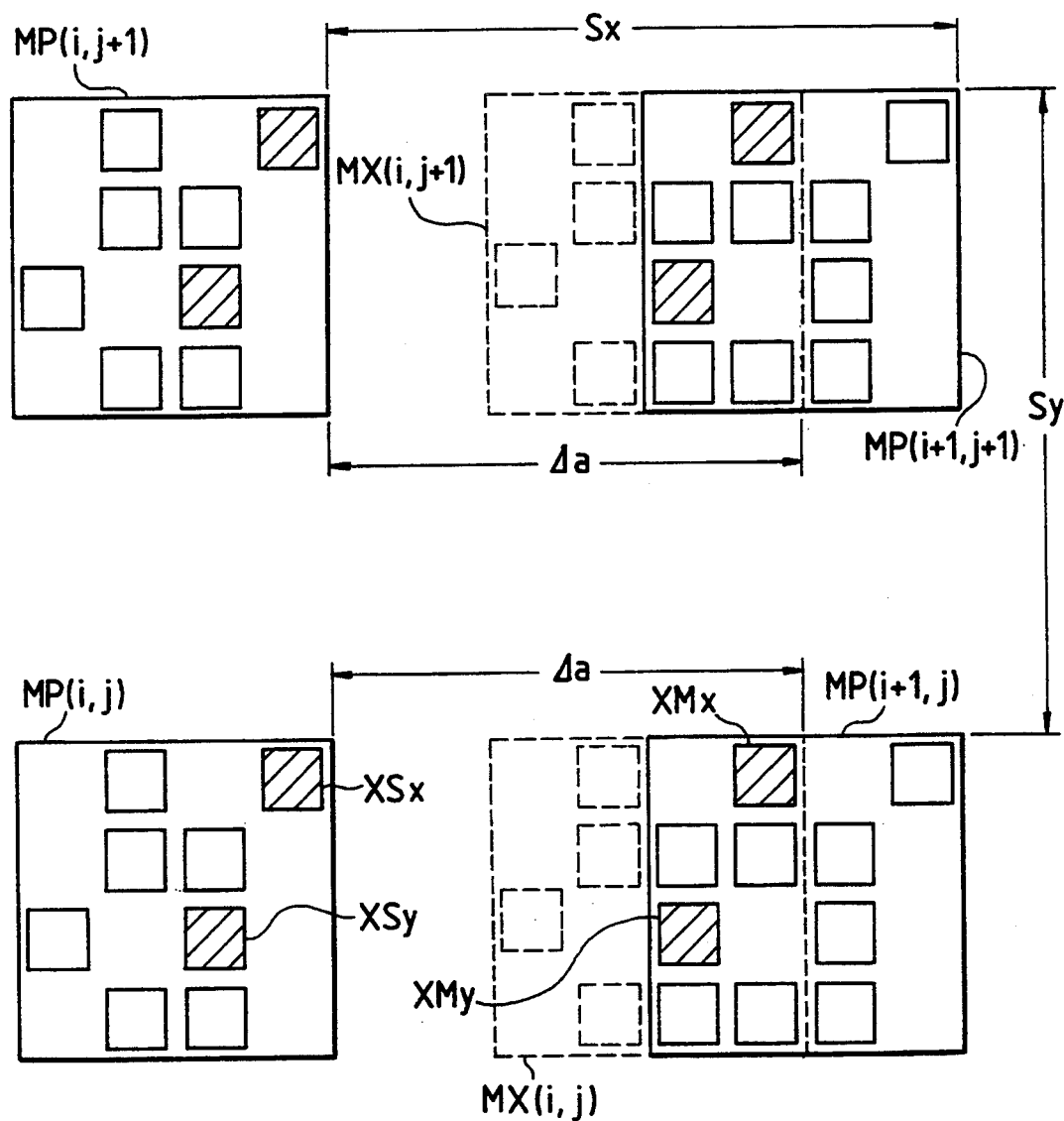
FIG. 20 is an enlarged plan view showing an overlapping state of a projected image of a first measurement mark, and a projected image obtained by shifting the projected image by $\Delta a$ in the X direction.
Figure 21:
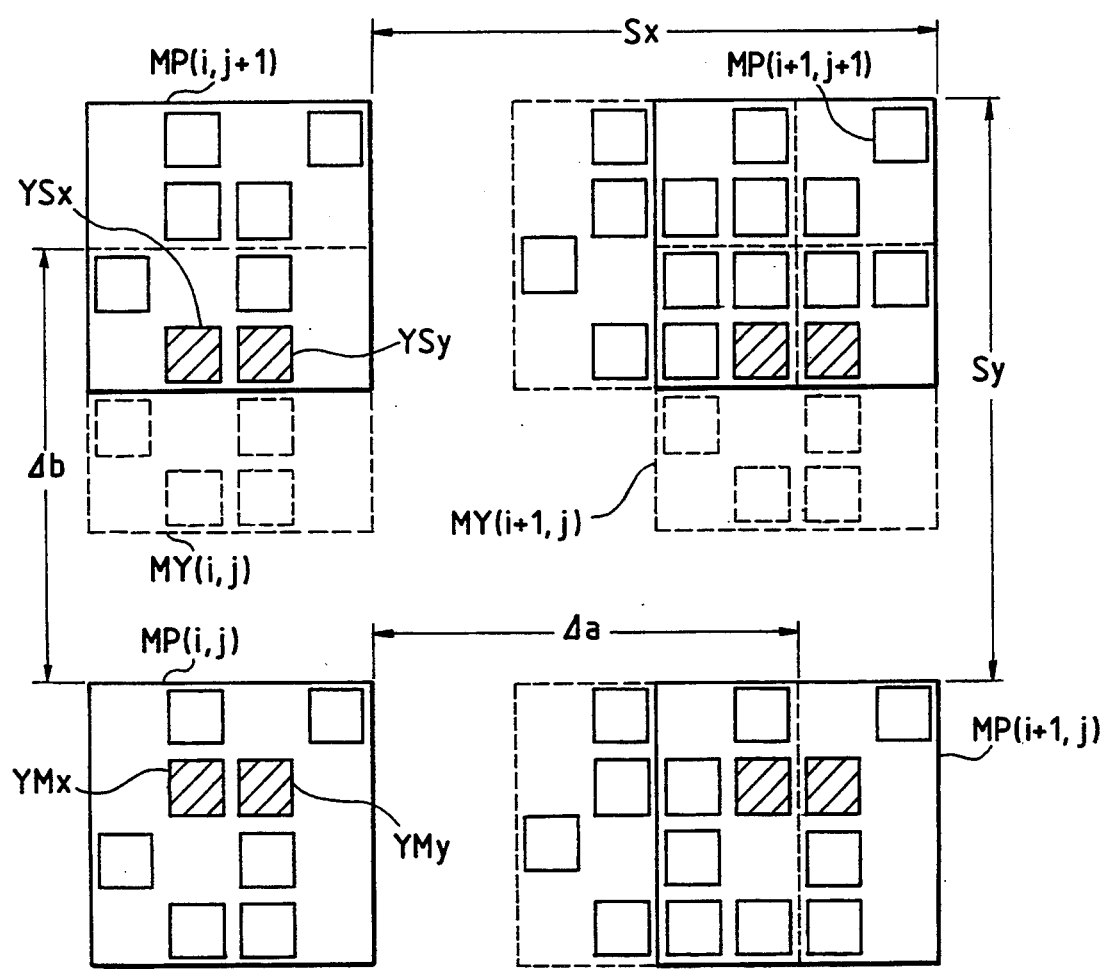
FIG. 21 is an enlarged plan view showing a projected image of a first measurement mark, a projected image obtained by shifting the projected image by $\Delta a$ in the X direction, and a projected image obtained by shifting the projected image by $\Delta b$ in the Y direction.

In step 101 in FIG. 18, a test reticle corresponding to the projected image shown in FIG. 14 is placed on the object surface of a projection optical system to be inspected, and the test reticle image 7P is projected onto a wafer W coated with a resist via the projection optical system, as shown in FIG. 19. Thereafter, in step 102, the wafer W is moved by pitches Px and Py in the X and Y directions by the step-and-repeat method, and the test reticle image is exposed on the wafer W in a matrix. Thus, as shown in FIG. 19, the test reticle image 7P and test reticle images $7P_{ij}$ which are the same as the image 7P are exposed on the wafer W at the pitches Px and Py in the X and Y directions.

In step 103 in FIG. 18, the wafer W is moved by $\Delta x$ from the state shown in FIG. 19 in the X direction, and the test reticle image 7P is overlap-exposed. Thereafter, in step 104, the wafer W is moved by $\Delta b$ from the state shown in FIG. 19 in the Y direction, and the test reticle image 7P is overlap-exposed. Thus, in FIG. 19, an image 12P obtained by shifting the image 7P by $\Delta a$ in the X direction, and an image 13P obtained by shifting the image 7P by $\Delta b$ in the Y direction are overlap-exposed on the test reticle image 7P, and an image obtained by shifting the image $7P_{ij}$ by $\Delta a$ in the X direction, and an image obtained by shifting the image $7P_{ij}$ by $\Delta b$ in the Y direction are overlap-exposed on each of other test reticle images $7P_{ij}$. In step 105, the triple-exposed wafer W is developed. If the resist layer on the wafer W is of positive type, only dark portions of the triple-exposed portions are left as projecting portions after development.

In step 106 in FIG. 18, the relative displacements, in the X and Y directions, between the fiducial and reference mark images on the developed wafer are measured. For example, the relative displacement in the X direction includes relative displacements between reference mark images XSx and XSy of an image MX(i, j) obtained by moving the measurement mark image MP (i, j) by $\Delta a$ in the X direction, and the fiducial mark images XMx and XMy of the neighboring measurement mark image MP(i+1, J) obtained in the first exposure process, and these relative displacements in the X and Y directions are measured by the method described above with reference to FIGS. 17A and 17B. Similarly, the relative displacement in the Y direction includes relative displacements between the fiducial mark images YMx and YMy of an image MY(i, j) obtained by moving the measurement mark image MP(i, j) by $\Delta b$ in the Y direction, and the reference mark images YSx and YSy of the neighboring measurement mark image MP(i, j+1) formed in the first exposure process, and these relative displacements in the X and Y directions are measured by the method described above with reference to FIGS. 17A and 17B.

Thereafter, in step 107, differences (distortion differential values) between distortion values in the X and Y directions are calculated by the differential method. For example, when the X component of the distortion differential value in the X direction is to be calculated, if the measurement mark images MP(p, j), MP(p+1, j), . . . , MP(q, j) in FIG. 14 are caused to correspond to the measurement points $x_p, x_{p+1}, \ldots, x_q$ in FIG. 12A, relative displacements $D(x_i)$ in the X direction between the fiducial and reference mark images at these measurement points are simply calculated, as shown in FIG. 12B. Thereafter, when each relative displacement $D(x_i)$ is multiplied with $Sx/\Delta a$, a corrected distortion differential value $d_i$ (FIG. 12C) is obtained. Similarly, the Y component of the distortion differential value in the X direction, and the X and Y components of the distortion differential value in the Y direction are calculated.

In step 108 in FIG. 18, the stepping error is corrected from these distortion differential values. In this case, in this embodiment, as shown in FIG. 19, an image $7P_{21}$ projected in the first exposure process, and an image P12 exposed by laterally shifting the image $7P_{21}$ by $\Delta a$ in the X direction in the second exposure process overlap each other at a measurement point 14. On the measurement point 14, a measurement mark image MP(1, j) (see FIG. 14) on the image $7P_{21}$ and a measurement mark image MP(m, j) on the image 12P are exposed to overlap each other. Similarly, in FIG. 19, an image $7P_{12}$ projected in the first exposure process, and an image 13P exposed by laterally shifting the image $7P_{12}$ by $\Delta b$ in the Y direction in the third exposure process overlap each other at a measurement point 15 in FIG. 19. On the measurement point 15, a measurement mark image MP(i, 1) (see FIG. 14) on the image $7P_{12}$ and a measurement mark image MP(i, n) on the image 13P are exposed to overlap each other. In this case, the distance from the measurement mark image MP(1, j) on the test reticle image 7P to the measurement mark image MP(1, j) on the image $7P_{21}$ is measured with high precision by, e.g., a laser interferometer, and the distance from the measurement mark image MP(i, 1) on the test reticle image 7P to the measurement mark image MP(i, 1) on the image $7P_{12}$ is also measured with high precision by the laser interferometer.

An overlapping error between the measurement mark image MP(m, j) in the second shot (e.g., image 12P) and the measurement mark image MP(1, j) in the neighboring first shot (e.g., image $7P_{21}$), and an overlapping error between the measurement mark image MP(i, n) in the third shot (e.g., image 13P) and the measurement mark image MP(i, 1) in the neighboring first shot are calculated. Then, an average value ($\Delta$Minx, $\Delta$Miny) obtained by averaging the overlapping errors in the X direction in units of shot regions in FIG. 19, and an average value ($\Delta$Mmjx, $\Delta$Mmjy) obtained by averaging the overlapping errors in the Y direction in units of shot regions in FIG. 19 are calculated.

Also, assuming that a value (Px+$\Delta$Minx, $\Delta$Miny) obtained by adding the pitch Px, in the X direction, between adjacent shots in FIG. 19, and the stepping error in the X direction in a vector manner is a difference between the positions of the measurement mark images MP(1, j) and MP(n, J), a stepping error (this includes X and Y components) $\epsilon$ in the X direction is calculated from equation (17), and each distortion differential value is corrected using equation (18). Similarly, assuming that a value ($\Delta$MmJx, Py+$\Delta$Mmjy) obtained by adding the pitch Py, in the Y direction, between adjacent shots in FIG. 19, and the stepping error in the Y direction in a vector manner is a difference between the positions of the measurement mark images MP(i, 1) and MP(i, n), each distortion differential value in the Y direction is corrected using equations (17) and (18). The positions (i, j) such as the measurement mark images MP(1, J), MP(i, 1), and the like in the shot used in correction of the differential value are not limited to a pair of positions, but a plurality of pairs of positions may be measured.

In step 109 in FIG. 18, a relative rotational error $\Delta \theta$ as a difference between the rotational angle of the wafer W in the second shot exposure process shifted by $\Delta a$ in the X direction, and the rotational angle of the wafer W in the third shot exposure process shifted by Δb in the Y direction is calculated. For this purpose, in FIG. 14, an overlapping error ($\Delta u_1$, $\Delta u_2$) at the coordinate position ($u_1$, $u_2$) between an image obtained by shifting the rotation measurement mark image R1 by Δa in the X direction, and an image obtained by shifting the mark image R2 by Δb in the Y direction is calculated. Similarly, an overlapping error ($\Delta v_1$, $\Delta v_2$) at the coordinate position ($v_1$, $v_2$) between an image obtained by shifting the rotation measurement mark image R3 by Δa in the X direction, and an image obtained by shifting the mark image R4 by Δb in the Y direction is calculated. Thereafter, the relative rotation error Δθ between the second and third shots is calculated using equation (19). In this embodiment, the measurement of the rotational error Δθ between shots is performed by calculating the relative displacement between two points on a shot region. However, the number of points to be measured is not limited to 2, but the relative displacement may be measured at three or more points to calculate the rotational error Δθ.

In step 110 in FIG. 18, each distortion differential value in the Y direction is corrected for the shot rotational error θ using equations (20) to (23). Thereafter, in step 111, the distortion differential values in the X direction are sequentially accumulated to calculate distortion values in the X direction at the respective measurement points. Similarly, the distortion differential values in the Y direction are sequentially accumulated to calculate distortion values in the Y direction at the respective measurement points.

Upon manufacture of a test reticle having the projected image shown in FIG. 14, an electron beam drawing method and a photorepeater method may be proposed. Of these methods, when the electron beam drawing method is used, an original image pattern of fiducial mark images (e.g., XMx), and an original image pattern of the corresponding reference mark images (e.g., XSx) in the measurement mark image MP(i, j) in FIG. 15A are preferably formed by drawing without movement of a reticle to be subjected to drawing. Thus, the intervals Δa and Δb in the X and Y directions between the fiducial and reference mark images can precisely coincide with designed values, and distortion characteristics can be measured with high precision.

On the other hand, when a test reticle is manufactured by the photorepeater method, it is preferable that fiducial marks and corresponding reference marks are simultaneously exposed on the test reticle in units of exposure processes. Thus, distortion characteristics can be measured with high precision.

The patterns of the measurement marks and rotation measurement marks formed on the test reticle are not limited to those in the projected image shown in FIGS. 15A to 16. That is, marks having any patterns may be adopted as long as the position difference between a measurement fiducial position and a corresponding measurement object position can be measured.

The stepping error correction need not always be performed between positions at two ends of a shot region. As the interval between the positions becomes larger, the number of steps of the difference therebetween is increased. For this reason, if the stepping error ($\Delta_{pq} - D_{pq}$) can be measured in equation (18) while the measurement error remains the same, since the denominator ($\overline{q} - \overline{p}$) of the correction value becomes larger, the error of the stepping correction value ε can be decreased.

Furthermore, in the above embodiment, the rotational error correction is performed with reference to shots in the X direction, but may be performed with reference to shots in the Y direction. Also, shots in the both directions may be subjected to rotation correction with reference to the average rotational error of the shots in the X and Y directions.

The direction to calculate the differential values in distortion measurement is not limited to the X and Y directions. For example, distortion values may be calculated in a direction crossing the X axis at 45° in the counterclockwise direction, and a direction crossing the X axis at 45° in the clockwise direction.

What is claimed is:

1. A distortion inspection method for a projection optical system for inspecting distortion characteristics of a projection optical system to be inspected by arranging a mask formed with measurement patterns at a plurality of predetermined positions on the object surface side of said projection optical system, transferring projected images of the plurality of measurement patterns onto a photosensitive substrate arranged on the image surface side of said projection optical system, and detecting transfer images of the measurement patterns; comprising:

the first step of exposing a mask, on which pairs of first and second measurement patterns are arranged adjacent to each other to be separated by a predetermined interval ΔT in one direction at positions on the mask corresponding to a plurality of points at which distortion amounts are to be inspected in a projection view field of said projection optical system, onto said photosensitive substrate via said projection optical system;

the second step of exposing said mask onto said photosensitive substrate via said projection optical system after said mask and said photosensitive substrate are moved relative to each other by an amount determined by the interval ΔT with respect to the state in the first step;

the third step of measuring relative displacements between overlapping images of the first and second measurement patterns at different image height points in the projection view field of said projection optical system; and the fourth step of calculating a value obtained by sequentially accumulating the measured relative displacements in units of image height values as a distortion amount at the corresponding image height point.

2. A distortion inspection method for a projection optical system for exposing images of measurement patterns onto a photosensitive substrate via a projection optical system to be inspected, and inspecting distortion characteristics of said projection optical system from states of the exposed images of the measurement patterns, comprising:

the first step of exposing an image on a mask, on which pairs of first main and sub measurement marks aligned at an interval ΔT1 in a first measurement direction, and pairs of second main and sub measurement marks aligned at an interval ΔT2 in a second measurement direction are formed at positions corresponding to a plurality of points at which distortion amounts are to be inspected in a projection view field of said projection optical system, onto said photosensitive substrate via said projection optical system;

the second step of exposing the image on said mask onto said photosensitive substrate via said projection optical system after said mask and said photosensitive substrate are moved in the first measurement direction relative to each other by an amount Δa determined by the interval ΔT1 and an interval between adjacent mark pairs, and exposing the image on said mask onto said photosensitive substrate via said projection optical system after said mask and said photosensitive substrate are moved in the second measurement direction relative to each other by an amount Δb determined by the interval ΔT2 and the interval between adjacent mark pairs;

the third step of measuring a relative displacement, in the first measurement direction, between the first main and sub measurement mark images, and a relative displacement, in the second measurement direction, between the second main and sub measurement mark images at each of the positions, corresponding to the plurality of points at which the distortion amounts are to be inspected of said projection optical system, on said photosensitive substrate;

the fourth step of exposing the first measurement mark images onto said photosensitive substrate via said projection optical system after said photosensitive substrate is moved by an amount corresponding to an exposure field size of said projection optical system in the first measurement direction, and exposing the second main measurement mark images onto said photosensitive substrate via said projection optical system after said photosensitive substrate is moved by the amount corresponding to the exposure field size of said projection optical system in the second measurement direction;

the fifth step of exposing the first sub measurement mark images near the first main measurement mark images exposed in the fourth step, and exposing the second sub measurement mark images near the second main measurement mark images exposed in the fourth step; and the sixth step of calculating stepping errors of said photosensitive substrate in the first and second measurement directions on the basis of intervals between the first and second main measurement mark images exposed in the fourth step, and the first and second sub measurement mark images exposed in the fifth step, wherein a distortion amount of said projection optical system is obtained by accumulating the relative displacements measured in the third step while correcting the stepping errors of the photosensitive substrate calculated in the sixth step.

3. A method according to claim 2, wherein a relative rotational amount between a case wherein exposure is performed after said mask and said photosensitive substrate are moved relative to each other by Δa in the first measurement direction, and a case wherein exposure is performed after said mask and said photosensitive substrate are moved relative to each other by Δb in the second measurement direction is calculated based on the image on said mask exposed in the second step, and after the relative rotational amount is corrected by correcting the stepping errors of said photosensitive substrate calculated in the sixth step, the distortion amount of the projection optical system is obtained by accumulating the relative displacements measured in the third step.

* * * * *